(12) United States Patent
Gorbachov et al.

(10) Patent No.: US 10,224,876 B2
(45) Date of Patent: Mar. 5, 2019

(54) LOW DROPOUT VOLTAGE REGULATOR FOR HIGHLY LINEAR RADIO FREQUENCY POWER AMPLIFIERS

(71) Applicant: SKYWORKS SOLUTIONS, INC., Woburn, MA (US)

(72) Inventors: Oleksandr Gorbachov, Irvine, CA (US); Lisette L. Zhang, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/370,941

(22) Filed: Dec. 6, 2016

(65) Prior Publication Data

US 2017/0163218 A1 Jun. 8, 2017

Related U.S. Application Data

(60) Provisional application No. 62/264,480, filed on Dec. 8, 2015.

(51) Int. Cl.
| | |
|---|---|
| *H04L 12/28* | (2006.01) |
| *H03F 1/02* | (2006.01) |
| *H03F 3/195* | (2006.01) |
| *H03F 3/24* | (2006.01) |
| *H04W 52/52* | (2009.01) |

(Continued)

(52) U.S. Cl.
CPC .......... *H03F 1/0216* (2013.01); *G05F 1/563* (2013.01); *H03F 1/32* (2013.01); *H03F 3/195* (2013.01); *H03F 3/245* (2013.01); *H04W 52/52* (2013.01); *H03F 2200/222* (2013.01); *H03F 2200/294* (2013.01); *H03F 2200/318* (2013.01); *H03F 2200/387* (2013.01); *H03F 2200/408* (2013.01); *H03F 2200/451* (2013.01)

(58) Field of Classification Search
USPC ......................................... 370/252, 329, 419
See application file for complete search history.

(56) References Cited

U.S. PATENT DOCUMENTS

| | | |
|---|---|---|
| 6,703,815 B2 | 3/2004 | Biagi |
| 8,324,876 B1 | 4/2012 | Le et al. |

(Continued)

OTHER PUBLICATIONS

Chae, Chang-Seok; Rae, Sung-Ho; Iizuka, Shinichi; Lee, Kwang-Chan; Cho, Gyu-Hyeong; "A Fully On-Chip VGA-Based Load-Independent Linear Amplitude Modulator for GSM/EDGE Polar Transmitters"; IEEE, 2008.

Giustolisi, Gianluca; Palumbo, Gaetano; Spitale, Ester; "Robust Miller Compensation with Current Amplifiers Applied to LDO Voltage Regulators"; IEEE Transactions on Circuits and Systems-I: Regular Papers, Vo. 59, No. 9, Sep. 2012.

(Continued)

*Primary Examiner* — John Pezzlo

(57) ABSTRACT

A radio frequency amplifier circuit has a signal input and a signal output. A primary amplifier is connected to the signal input and the signal output. A low dropout voltage regulator is connectible to an external power supply and to the primary amplifier, and generates a set voltage to bias the primary amplifier from a variable voltage provided by the external power supply. An equivalent capacitance circuit is connected to the primary amplifier and to the low dropout voltage regulator. The equivalent capacitance circuit defines a low dropout voltage regulator output capacitance in a nano-Farad to micro-Farad range absent any passive capacitor components corresponding thereto to maintain linearity of the primary amplifier.

22 Claims, 22 Drawing Sheets

(51) Int. Cl.
*G05F 1/563* (2006.01)
*H03F 1/32* (2006.01)
*H04J 1/16* (2006.01)

(56) References Cited

U.S. PATENT DOCUMENTS

| | | |
|---|---|---|
| 2008/0157866 A1 | 7/2008 | Smith et al. |
| 2013/0163697 A1 | 6/2013 | Moser |
| 2013/0241504 A1 | 9/2013 | Kumar et al. |
| 2013/0307502 A1 | 11/2013 | Rhattacharyya et al. |
| 2014/0292301 A1 | 10/2014 | Lee et al. |
| 2014/0323066 A1 | 10/2014 | Zhang et al. |
| 2015/0346748 A1 | 12/2015 | Pietri et al. |
| 2017/0052553 A1* | 2/2017 | Gebeyehu ............... G05F 1/575 |

OTHER PUBLICATIONS

Guan, Junqing; Negra, Renato; "A Linear Supply Modulator with High Dynamic Range for Polar Transmitters in LTE Application"; Proceedings of APMC 2012, Kaohsiun, Taiwan, Dec. 4-7, 2012.

Saberkari, A.; Martinez, H., Fathipour, R.; Alarcon, E.; "Fully-Integrated CMOS LDO Regulator Based on an Embedded Current-Mode Capacitor Multiplier"; IEEE Latin America Transactions, vol. 13, No. 4, Apr. 2015.

Texas Instruments; "Fundamental Theory of PMOS Low-Dropout Voltage Regulators", Application Report, Mixed-Signal Products, Apr. 1999.

Search Report & Written Opinion for PCT/US2016/065356; dated Feb. 17, 2017.

* cited by examiner

LOW DROPOUT VOLTAGE REGULATOR FOR HIGHLY LINEAR RADIO FREQUENCY POWER AMPLIFIERS

CROSS-REFERENCE TO RELATED APPLICATIONS

The application relates to and claims the benefit under 35 U.S.C. § 119(e) to U.S. Provisional Patent Application No. 62/264,480 filed Dec. 8, 2015 and entitled "LDO FOR HIGHLY LINEAR RF POWER AMPLIFIER," the entire contents of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) circuits, and more particularly, to low dropout voltage regulators for highly linear radio frequency power amplifiers.

2. Related Art

Complex, multi-function electronic devices are comprised of many interconnected modules and components, each of which serves a dedicated purpose. As a general example, wireless communication devices may be comprised of a transmit chain and a receive chain, with the antenna and the transceiver circuit being a part of both the transmit chain and receive chain. The transmit chain may additionally include a power amplifier for increasing the output power of the generated radio frequency signal from the transceiver, while the receive chain may include a low noise amplifier for boosting the weak received signal so that information can be accurately and reliably extracted therefrom.

The low noise amplifier and the power amplifier may together comprise a front end module or front end circuit, which also includes a radio frequency switch circuit that selectively interconnects the power amplifier and the low noise amplifier to the antenna. The connection to the antenna is switched between the receive chain circuitry, i.e., the low noise amplifier and the receiver, and the transmit chain circuitry, i.e., the power amplifier and the transmitter. In time domain duplex communications systems where a single antenna is used for both transmission and reception, this switching between the receive chain and the transmit chain occurs rapidly many times throughout a typical communications session. Besides radio frequency communications systems, switches and switch circuits find application in many other contexts.

The radio frequency switches and the amplifier circuits of the front end module are manufactured as an integrated circuit. Although the gallium arsenide (GaAs) or silicon-on-insulator (SOI) fabrication technologies were once favored for devices for high-power applications such as cellular communications systems and wireless local area network client interface devices, complementary metal oxide semiconductor (CMOS) fabrication is becoming increasingly mainstream for its lower manufacturing costs.

Radio frequency amplifier circuits ideally have a linear performance in order to meet the operational requirements of the wireless communications standards with which they must conform. CMOS transistors, however, are prone to a low breakdown voltage. Low dropout voltage (LDO) regulators may be embedded in the integrated transceiver circuitry as well as the radio frequency front end circuits, as reliable operation is possible with a limit voltage that exceeds the transistor voltage, while the external bias supply voltage (typically a battery) varies over a wide range. The internal voltage at the low dropout voltage regulator output follows the battery voltage, and at low battery voltage levels, the output is adjusted to have a small drop-out voltage. The low dropout voltage regulator also has a maximum internal voltage for reliable CMOS transistor operation, and is kept at a fixed level if the battery voltage is increased beyond a maximum. The drop out voltage is increased in this case, and is understood to be the equivalent of inserting a resistor at the output of the low dropout voltage regulator in series with a load.

A low dropout voltage regulator typically requires an input capacitor and an output capacitor to ensure proper operation, and perform within acceptable stability, load response, and input response parameters. For the transceiver circuitry, due to lower current consumption, such capacitors may have small values, typically in the ten pico-Farad to a couple hundred pico-Farad. Such small value capacitors may be readily integrated on the semiconductor die, though because of their substantial footprint on the die and additional consequent costs, external capacitors may be used instead.

For high current consumption circuits inside the transceiver or the radio frequency front end such as the power amplifier, a capacitor having a higher value in the range of several nano-Farads may be required. Implementing such a high capacitance is not possible on-die. Furthermore, when utilized in connection with radio frequency power amplifiers, as the drop out voltage of the regulator increases, linearity is degraded. In order to counteract the increased equivalent series resistance with the load, a higher value output capacitor may be necessary to maintain acceptable linearity.

Since on-die implementation is not possible, an external capacitor is necessary. Yet, in the highly miniaturized transceiver and front end circuits that are required in modern wireless communication devices with the smallest footprints, the addition of an external capacitor may be impractical, not only in terms of circuit board real estate, but also because of the limited pin count. Pin-to-pin compatibility issues may restrict integrated circuit pinout configurations for additional external capacitors, and is likely to impact circuit board layouts.

Accordingly, there is a need in the art for an improved low dropout voltage regulator that can be integrated on the same semiconductor die as the radio frequency amplifier circuitry, while maintaining a high level of linearity for the same. There is also a need for such circuits to avoid inclusion of an external low dropout voltage regulator output pin.

BRIEF SUMMARY

In accordance with one embodiment of the present disclosure, there is a radio frequency amplifier circuit with a signal input and a signal output. The circuit may include a primary amplifier connected to the signal input and the signal output. Additionally, there may be a low dropout voltage regulator connectible to an external power supply and to the primary amplifier. The low dropout voltage regulator may generate a set voltage to bias the primary amplifier from a variable voltage provided by the external power supply. The circuit may also include an equivalent capacitance circuit connected to the primary amplifier and to the low dropout voltage regulator. The equivalent capacitance circuit may define a low dropout voltage regulator output capacitance in a nano-Farad to micro-Farad range absent any passive capacitor components corresponding thereto to maintain linearity of the primary amplifier.

Another embodiment is directed to an equivalent capacitance circuit connectable to an output of a low dropout voltage regulator for a radio frequency amplifier circuit. The equivalent capacitance circuit may include an operational amplifier with an inverting input, a non-inverting input connected to ground, and a single-ended output. The circuit may further include a capacitor connected to the inverting input of the operational amplifier and a resistor connected to the single-ended output of the operational amplifier. A tap point at a junction connecting the capacitor and the resistor may be defined, with the output of the low dropout voltage regulator being connectable thereto. The tap point may define an equivalent capacitance value in a nano-Farad to micro-Farad range at a predefined operating frequency.

Still another embodiment of the present disclosure is a low dropout voltage regulator for a radio frequency amplifier circuit. The regulator may include an operational amplifier connected to an external power source and may further include a reference input and an error input. The regulator may also include a reference voltage setting resistor connected to the reference input and to a current reference. Additionally, there may be a feedback circuit that is connected to the error input of the operational amplifier. The feedback circuit may define a feedback factor, as well as include a first feedback resistor and a second feedback resistor. The regulator may include a first pass element connected to the external power source, and a second pass element connected to the external power source and to the first pass element. An output port of the low dropout voltage regulator may be defined by a junction of the first pass element and the second pass element. The output port may be characterized by an equivalent capacitance value in a nano-Farad to micro-Farad range. The output port may generate a predefined output voltage that corresponds to the reference voltage setting resistor, the current reference, and the feedback factor.

The present disclosure also contemplates a radio frequency communications module with the aforementioned amplifier circuit, as well as a wireless communications device that incorporates such a radio frequency communications module. The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 10B shows a 40 MHz tone spacing, and FIG. 10C shows a 80 MHz tone spacing;

DETAILED DESCRIPTION

The detailed description set forth below in connection with the appended drawings is intended as a description of the several presently contemplated embodiments of low dropout (LDO) voltage regulators, equivalent capacitance circuits utilized therein, and amplifier circuits incorporating such LDO voltage regulators, and are not intended to represent the only form in which the disclosed circuits may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
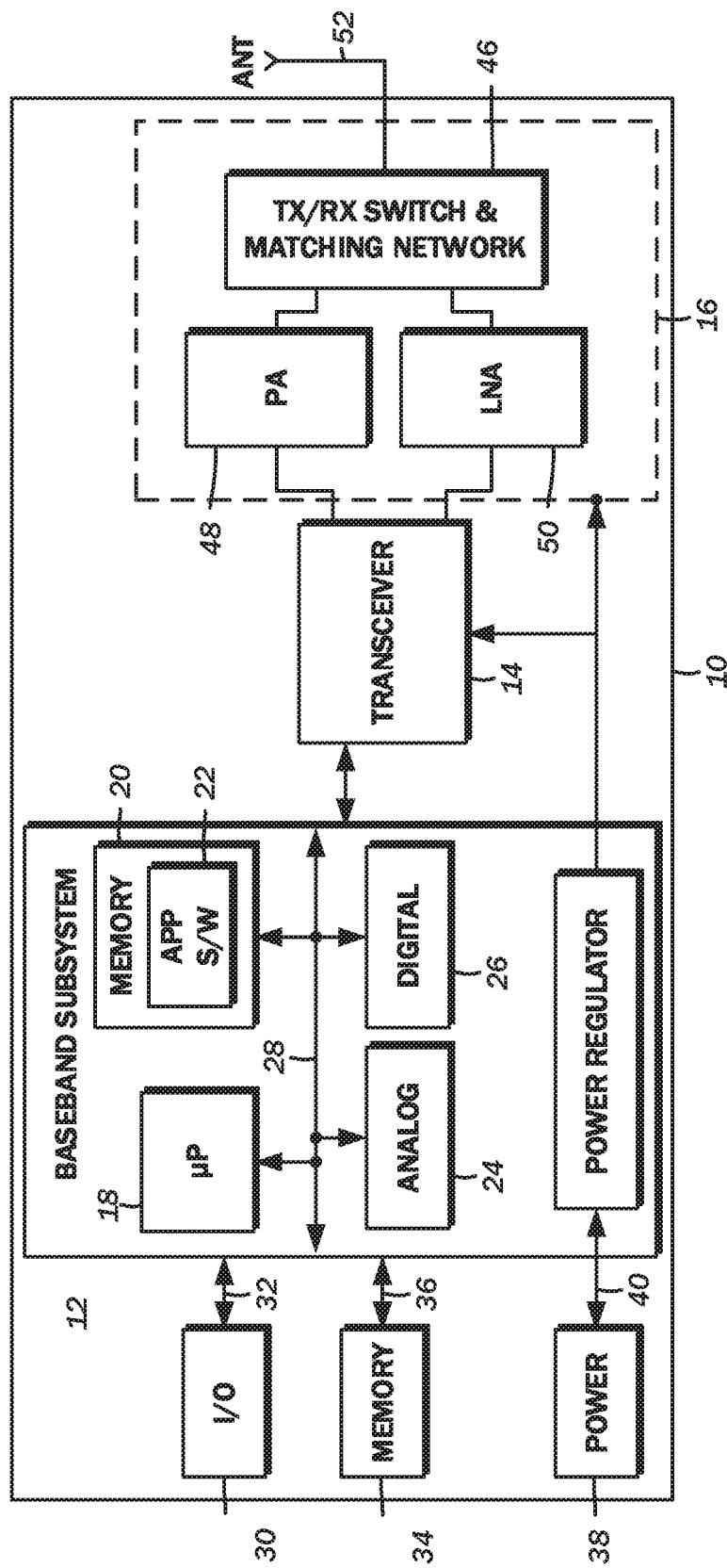
FIG. 1 a block diagram of an exemplary wireless communications device that may incorporate a low dropout voltage regulator in accordance with the present disclosure.

FIG. 1 is a block diagram illustrating a simplified wireless communications device 10 in which the low dropout voltage regulators of the present disclosure may be utilized. In various embodiments, the wireless communications device 10 can be a cellular telephone. However, the low dropout voltage regulator may be utilized in connection with any device incorporating an amplifier and a stable supply voltage is needed. The wireless communications device 10 illustrated in FIG. 1 is intended to be a simplified example of a cellular telephone and to illustrate one of many possible applications in which the low dropout voltage regulator may be utilized. One having ordinary skill in the art will understand the operation of a cellular telephone, and, as such, implementation details are omitted.

The wireless communications device 10 includes a baseband subsystem 12, a transceiver 14, and a front end module 16. Although omitted from FIG. 1, the transceiver 14 includes modulation and upconversion circuitry for preparing a baseband information signal for amplification and transmission, and includes filtering and downconversion circuitry for receiving and downconverting a radio frequency signal to a baseband information signal to recover data. The details of the operation of the transceiver 14 are known to those skilled in the art.

The baseband subsystem 12 generally includes a processor 18, which can be a general purpose or special purpose microprocessor, a memory 20, application software 22, analog circuit elements 24, and digital circuit elements 26, all connected over a system bus 28. The system bus 28 can include the physical and logical connections to couple the above-described elements together and enable their interoperability.

An input/output (I/O) element 30 is connected to the baseband subsystem 12 over a connection 32, a memory element 34 is coupled to the baseband subsystem 12 over a connection 36 and a power source 38 is connected to the baseband subsystem 12 over connection 40. The I/O element 30 can include, for example, a microphone, a keypad, a speaker, a pointing device, user interface control elements, and any other device or system that allows a user to provide input commands and receive outputs from the wireless communications device 10.

The memory element 34 can be any type of volatile or non-volatile memory, and in an embodiment, can include flash memory. The memory element 34 can be permanently installed in the wireless communications device 10, or can be a removable memory element, such as a removable memory card.

The power source 38 can be, for example, a battery, or other rechargeable power source, or can be an adaptor that converts AC power to the correct voltage used by the wireless communications device 10. In an embodiment, the power source can be a battery that provides a nominal voltage output of approximately 3.6 volts (V). However, the output voltage range of the power source can range from approximately 3.0 to 6.0 V. As will be appreciated, the power source 38 or battery may output a voltage level higher than what is needed by the components of the wireless communications device 10 at full charge, and gradually reduce the voltage level as it is discharged. Accordingly, baseband subsystem may include a central power regulator circuit 42 with the contemplated low dropout voltage regulator of the present disclosure, which stabilizes or regulates the voltage level, then distributes the same to each of the components of the wireless communications device 10. Each of the subsystems and/or components may be connected to the central power regulator circuit 42 over a power bus 44. Alternatively, each subsystem may have a separate power regulation circuit, as different components may have varying source power stability requirements.

The processor 18 can be any processor that executes the application software 22 to control the operation and functionality of the wireless communications device 10. The memory 20 can be volatile or non-volatile memory, and in an embodiment, can be non-volatile memory that stores the application software 22.

The analog circuit elements 24 and the digital circuit elements 26 include the signal processing, signal conversion, and logic that convert an input signal provided by the I/O element 30 to an information signal that is to be transmitted. Similarly, the analog circuit elements 24 and the digital circuit elements 26 include the signal processing, signal conversion, and logic that convert a received signal provided by the transceiver 14 to an information signal that contains recovered information. The digital circuit elements 26 can include, for example, a Digital Signal Processor (DSP), a Field Programmable Gate Array (FPGA), or any other processing device. Because the baseband subsystem 12 includes both analog and digital elements, it is sometimes referred to as a mixed signal circuit.

The front end module 16 is generally comprised of components belonging to a transmit signal chain, components belonging to a receive signal chain, and a switch 46. For purposes of simplification, the transmit signal chain is generally represented by a power amplifier 48, while the receive signal chain is generally represented by a low noise amplifier 50. The switch 46 interconnects the power amplifier 48 and the low noise amplifier 50 to an antenna 52. The front end module 16 depicted in FIG. 1 is understood to be for a single wireless operating mode, and those having ordinary skill in the art will appreciate that a conventional wireless communications device 10 has multiple wireless operating modes conforming to different standards. Accordingly, there may be multiple front end modules 16 particularly configured for each operating mode, or one front end module 16 with multiple constituent components for each operating mode. Along these lines, these different operating modes may utilize more than one antenna at a time (diversity mode operation), so the single antenna 52 is presented by way of example only and not of limitation.

Figure 2:
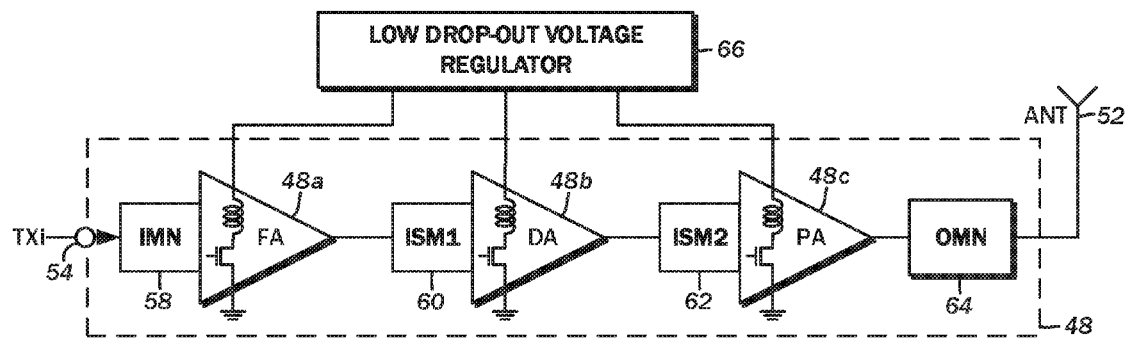
FIG. 2 is a block diagram of an exemplary multi-stage power amplifier circuit with which the disclosed low dropout voltage regulator may be utilized.

Again, as indicated above, the front end module 16, including the constituent components of the power amplifier 48 and the low noise amplifier 50, may be connected to the central power regulator circuit 42, that is, a supply voltage to bias the amplifier circuits is generated by the central power regulator circuit 42 and provided to the pertinent voltage supply inputs of the integrated circuits. In a different representation of the power amplifier 48 shown in FIG. 2, the power amplifier 48 is comprised of multiple amplification stages, including a first stage 48a, a driver amplifier stage 48b, and a power amplifier stage 48c.

A radio frequency signal generated by the transceiver 14 is passed to a power amplifier input 54, and sequentially amplified in stages to be output from a power amplifier output 56. The first stage 48a is typically a voltage amplification stage, with ensures that the radio frequency signal from the transceiver 14 has adequate voltage for the subsequent amplification stage. The driver amplifier stage 48*b* is understood to increase current for further power amplification by the power amplifier stage 48*c*.

The first stage 48*a* may include an input matching network 58 that impedance matches the power amplifier 48 to the transceiver 14. Along these lines, the driver amplifier stage 48*b* may include a first inter-stage matching network 60, which impedance matches the driver amplifier stage 48*b* to the first stage 48*a*. Additionally, the power amplifier stage 48*c* includes a second inter-stage matching network 62 that similarly impedance matches the power amplifier stage 48*c* to the driver amplifier stage 48*b*. The output of the power amplifier stage 48*c* is connected to an output matching network 64 that impedances matches the power amplifier 48 to the antenna 52 and/or the switch 46 mentioned earlier.

The bias voltage of each of the aforementioned amplifier stages 48*a*-48*c* may be provided by a low dropout (LDO) voltage regulator 66. As will be recognized by those having ordinary skill in the art, the LDO voltage regulator 66 is connected to the power source 38, and maintains the output voltage at a set value. It is understood that a conventional LDO voltage regulator requires an input capacitor as well as an output capacitor for maintaining stability, and desired load and input responses. In a typical configuration, the input capacitor may have a value in the tens of pico-Farads, so on-die implementation of the same is understood to be possible. However, the output capacitor typically has a value in the range of nano-Farads to micro-Farads, and on-die implementation thereof may not be possible. Accordingly, various embodiments of the present disclosure contemplate the elimination of any components external to the integrated circuit die to serve as or corresponding to the output capacitor for the LDO voltage regulator 66. That is, the embodiments of the amplifier circuits disclosed herein utilize an equivalent capacitance that may be implemented on the same integrated circuit die as the LDO voltage regulator 66.

Figure 3:
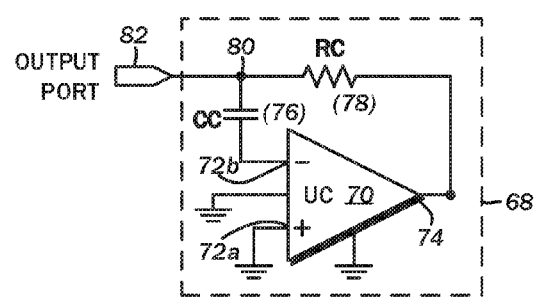
FIG. 3 is a schematic diagram of one embodiment of an equivalent capacitance circuit that may be incorporated into the contemplated low dropout voltage regulator.

Referring now to the schematic diagram of FIG. 3, one embodiment of an equivalent capacitance circuit 68 is generally comprised of an operational amplifier UC 70 having a non-inverting input 72*a*, an inverting input 72*b*, and a single-ended output 74. The non-inverting input 72*a* is connected to ground, though there are some embodiments in which a resistor may be connected to the non-inverting input 72*a* and to ground. The inverting input 72*b* is connected to a capacitor CC 76. There may also be a resistor RC 78 that is connected to the single-ended output 74, and to the capacitor CC 76.

The junction between the resistor RC 78 and the capacitor CC 76 may be referred to herein as a tap point 80, to which the output of the LDO voltage regulator 66 is connected as will be described in further detail below. In this regard, the tap point 80 may also correspond to an output port 82. The equivalent capacitance circuit 68 is understood to define a capacitance in the aforementioned nano-Farad to micro-Farad range to serve as an on-die replacement for the output capacitor utilized in connection with the LDO voltage regulator 66. The operational amplifier UC 70 is understood to have a positive power supply connection and a negative power supply connection, with the positive power supply connection being connected to the power source 38, e.g., the battery, and the negative power supply connection being connected to ground.

Figure 4:
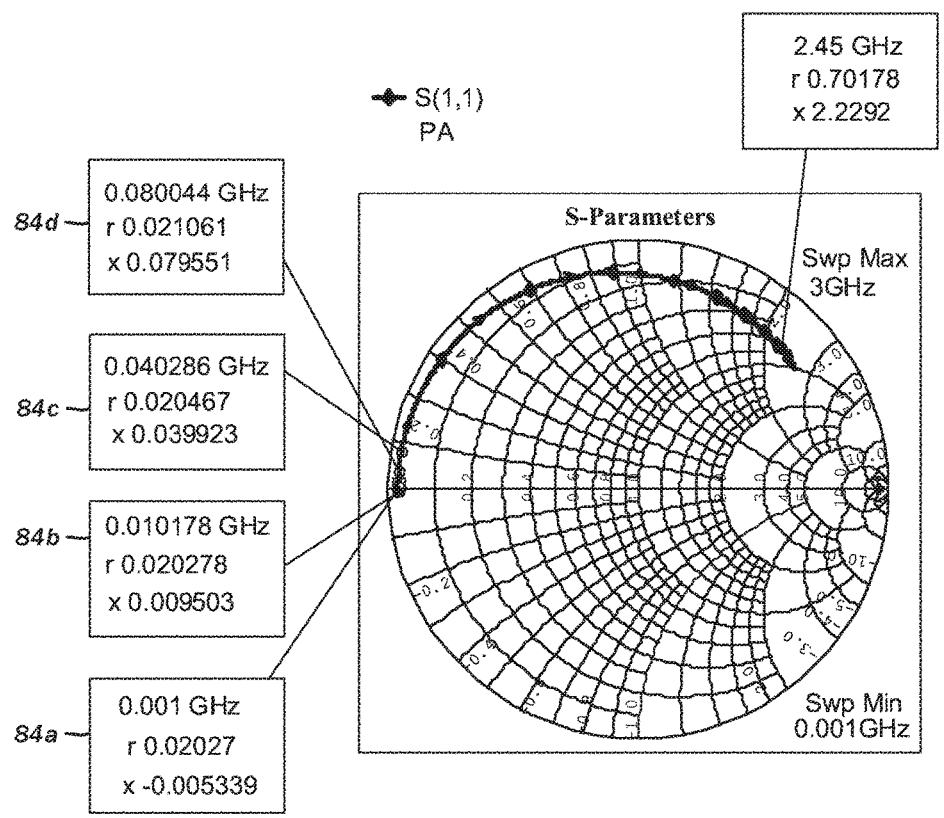
FIG. 4 is a Smith chart plotting the input reflection coefficient of the equivalent capacitance circuit shown in FIG. 3.

According to one preferred, though optional embodiment, the capacitor CC 76 has a capacitance of 1 pF, while the resistor RC 78 has a resistance of 300Ω. However, this is presented by way of example only and not of limitation. It is within the purview of those having ordinary skill in the art to tune the equivalent capacitance circuit 68 including the external passive components connected to the operational amplifier UC 70 to meet specific implementation parameters. As configured, the direct current and low frequency gain is understood to have a high value, e.g., greater than 200. Additionally, the output impedance is understood to have a low value, e.g., in the range of 100Ω to approximately 300Ω. The half power point bandwidth (3 dB bandwidth) is contemplated to encompass the operating frequency of the baseband subsystem 12, which may be between 20 MHz and 40 MHz, as the output capacitance is dependent on the baseband frequency to the extent digital modulation is applied to the radio frequency signal. Referring to the Smith chart of FIG. 4 plotting the input reflection coefficient S11, impedance at the lower frequency ranges between 1 MHz and 80 MHz is low as shown in plot points 84*a*, 84*b*, 84*c*, and 84*d*.

Figure 5:
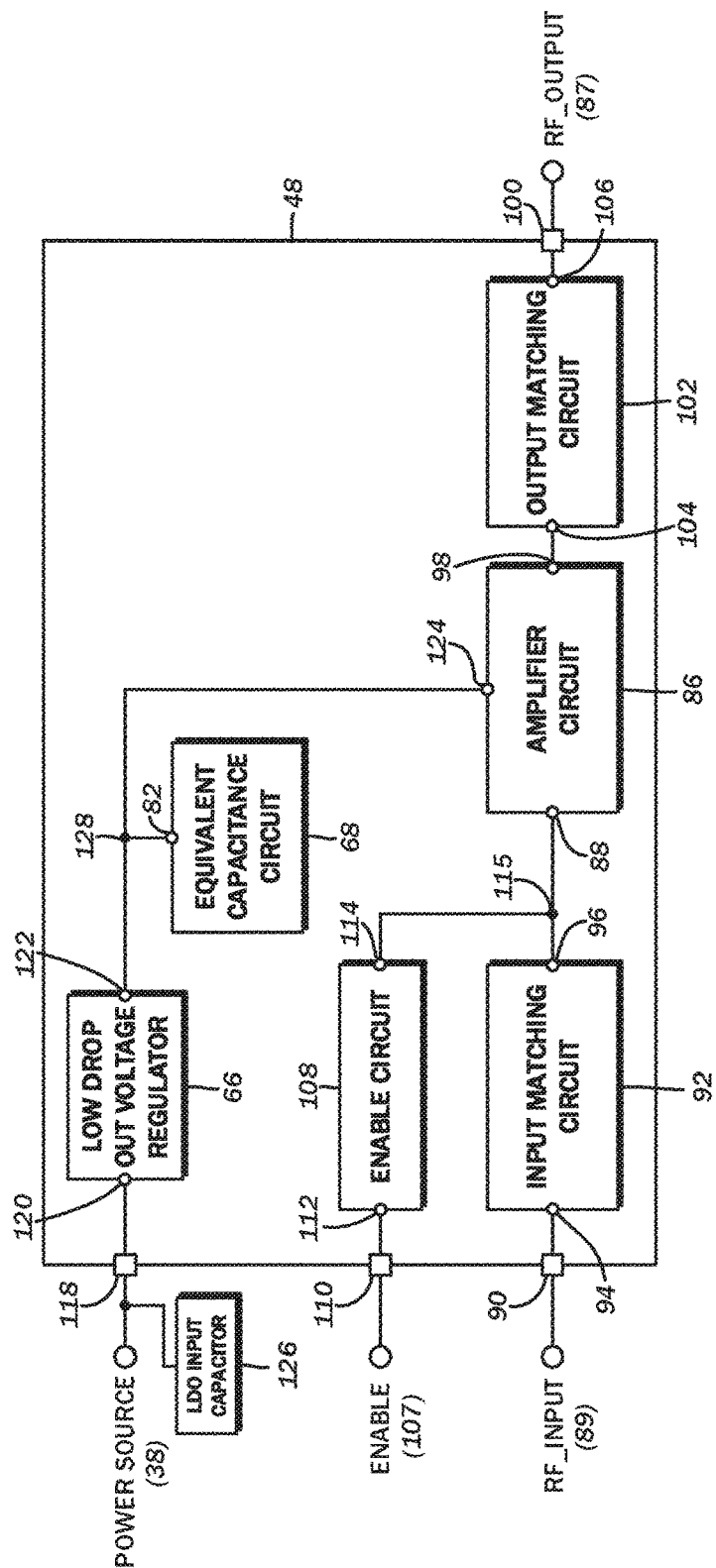
FIG. 5 is a block diagram of an exemplary radio frequency amplifier in accordance with another embodiment of the present disclosure.

The block diagram of FIG. 5 illustrates the power amplifier 48 in accordance with one embodiment of the present disclosure. The power amplifier 48 includes an amplifier circuit 86 that has an input 88 for a radio frequency transmit signal 89 provided to a signal input port 90 of the power amplifier 48. The amplifier circuit 86 is impedance matched to the circuitry connected to the signal input port 90, e.g., the transceiver 14, with an input matching circuit 92 defined by an input 94 and an output 96. More particularly, the input 94 of the input matching circuit 92 is connected to the signal input port 90 of the power amplifier 48, while the output 96 is connected to the input 88 of the amplifier circuit 86.

The amplifier circuit 86 amplifies the aforementioned radio frequency transmit signal 89 and passes the amplified signal 87 to an output 98. The amplifier circuit 86 is also impedance matched to the circuit component connected to a radio frequency signal output port 100 of the power amplifier 48, which is understood to be the switch 46 and/or the antenna 52. In this regard, there is an output matching circuit 102 with an input 104 connected to the output 98 of the amplifier circuit 86, and an output 106 connected to the radio frequency signal output port 100.

The amplifier circuit 86 is selectively activated by an enable circuit 108, which in turn is activated and deactivated via an enable signal 109 provided to an enable port 110 of the power amplifier 48. The enable circuit 108 is understood to include an input 112 connected to the enable port 110, and an output 114 that is connected to the amplifier circuit 86, specifically the input 88 thereof. As illustrated in FIG. 5, the enable circuit 108 is connected to a junction 115 defined along the interconnection between the input matching circuit 92 and the amplifier circuit 86, though it will be appreciated that is to show the functional interrelationship of these components, where the enable circuit 108 controls the amplifier circuit 86 through its input 88. As will be described in further detail below, one embodiment contemplates the connection of the enable circuit 108 to a port that does not necessarily correspond to the output 96 as described, though the enable signal 109 is ultimately passed through to the input 88 of the amplifier circuit 86 and controls it by setting a bias point of the transistor therein.

The bias voltage for the amplifier circuit 86 is provided by a power source 38, though the supplied voltage is controlled with the LDO voltage regulator 66. The power amplifier 48 includes a power supply port 118 to which the power source 38 is connected. The LDO voltage regulator 66 includes an input 120 that is connected to the power supply port 118, and an output 122 that is connected to a voltage supply input 124 of the amplifier circuit 86. Although the block diagram of FIG. 5 illustrates a separate voltage supply input 124, as will be shown below, this is for showing the functional interrelationship of the amplifier circuit 86 and the LDO voltage regulator 66. Like the connection of the enable circuit 108 to the amplifier circuit 86, the LDO voltage regulator 66 is not directly connected to the amplifier circuit 86 as depicted, but through other components that may be characterized as part of the output matching circuit 102. Yet, the voltage generated by the LDO voltage regulator 66 is primarily utilized by the amplifier circuit 86 to bias its transistor M1.

A variable voltage is provided by the power source 38, as a high battery charge level outputs a higher voltage, and as the battery is discharged, the voltage is understood to decrease. The LDO voltage regulator 66 generates a constant voltage for the amplifier circuit 86 throughout these variations in the supply voltage from the battery.

As indicated above, the LDO voltage regulator 66 typically relies upon an input capacitor and an output capacitor to ensure stable operation and linearity of the amplifier circuit 86 being powered therefrom. In the illustrated embodiment, an LDO input capacitor 126 is connected to the power supply port 118, and is understood to be external to the power amplifier 48. Additionally, connected to the output 122 of the LDO voltage regulator 66 is the equivalent capacitance circuit 68. The output 122 of the LDO voltage regulator 66, the voltage supply input 124 of the amplifier circuit 86, and the output port 82 of the LDO voltage regulator 66 are understood to be interconnected at a junction 128. The equivalent capacitance circuit 68 is contemplated to be as described above in the illustrated embodiment of the power amplifier 48.

The equivalent capacitance circuit 68 and the LDO voltage regulator 66, together with the amplifier circuit 86, the input matching circuit 92, the output matching circuit 102, and the enable circuit 108 may be fabricated on a single semiconductor die in accordance with one embodiment of the present disclosure. In this regard, the signal input port 90, the radio frequency signal output port 100, the enable port 110, and the power supply port 118 are bonding pads on the semiconductor die to which bond wires to external contacts of the die packaging are attached. There is no need for an externally connected capacitor to serve as the LDO output capacitor, particularly those of such high capacitance values as would be needed for the LDO voltage regulator 66. This also eliminates a bonding pad on the semiconductor die and a contact on the packaging that would have otherwise been needed for connecting such capacitor. Additional details of the semiconductor die and the packaging thereof will be described in further detail below.

Figure 6:
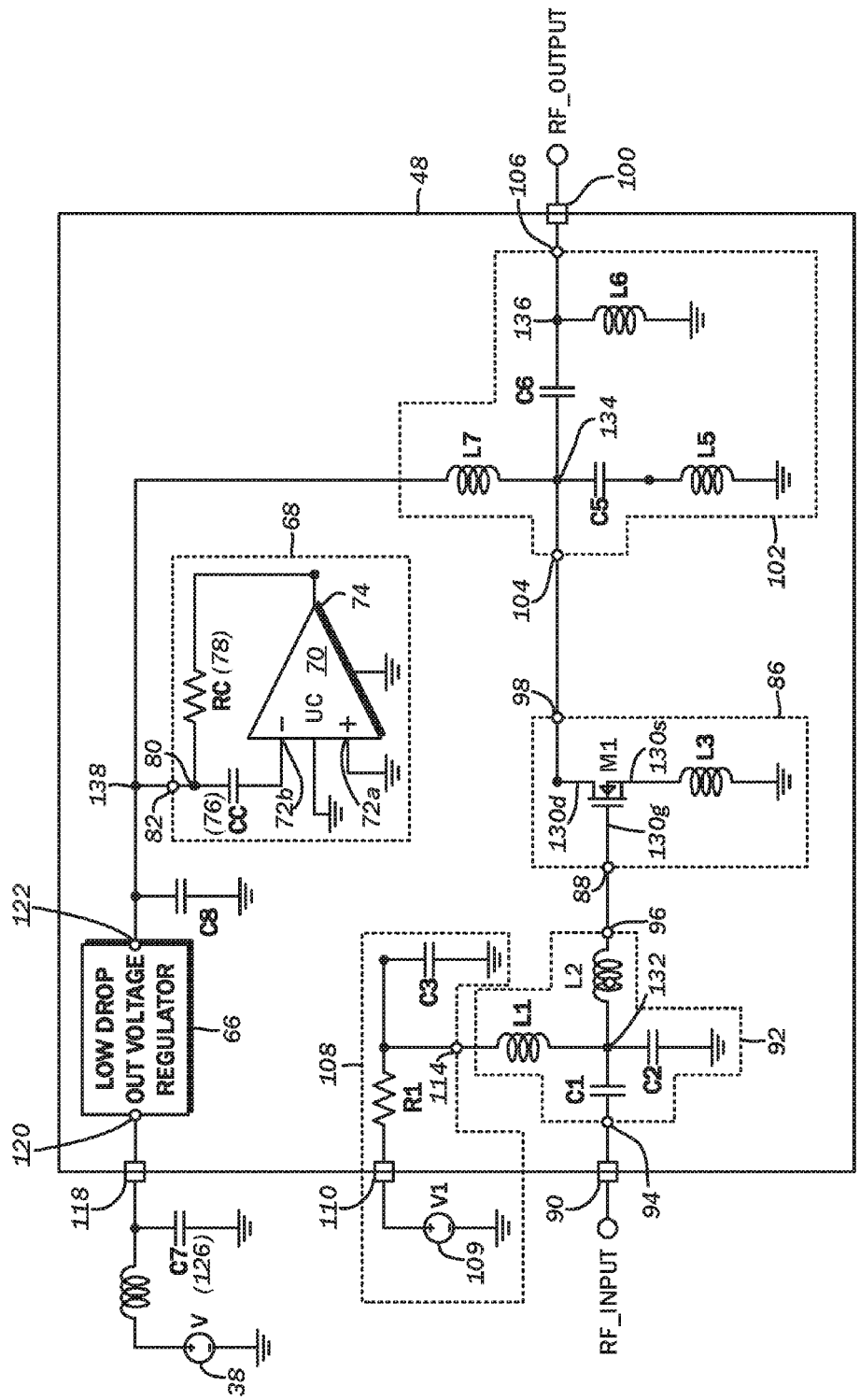
FIG. 6 is a schematic diagram of the radio frequency amplifier shown in FIG. 5.

With reference to the schematic diagram of FIG. 6, further details of the power amplifier 48 will now be considered. In the illustrated embodiment, the amplifier circuit 86 is a single stage radio frequency power amplifier based upon a transistor M1 having a drain 130*d* that corresponds to the aforementioned voltage supply input 124 of the amplifier circuit 86, a source 130*s* connected to ground via an inductor L3 (typically bond wire), and a gate 130*g* corresponding to the input 88 of the amplifier circuit 86.

Although the transistor M1 is depicted as a field effect transistor, this is by way of example only and not of limitation. Any suitable type of transistor may be substituted without departing from the scope of the present disclosure. Furthermore, while reference is made to certain features that are specific to field effect transistors such as the gate, the source, and the drain, to the extent different types of transistors are substituted, those features are understood to have corollary features for such alternative transistor types, such as base, emitter, and collector. The transistors and the related circuitry may be fabricated using silicon-based technologies such as bulk CMOS (complementary metal oxide semiconductor), SOI (silicon-on-insulator), and BiCMOS (integration of bipolar junction and complementary metal oxide semiconductor fabrication technologies). Other semiconductor technologies such as GaAs (gallium arsenide) may also be utilized.

The input matching circuit 92 is comprised of a capacitor C1, one terminal thereof corresponding to the input 94 of the input matching circuit 92. Additionally, there is a capacitor C2 connected to ground and to the capacitor C1 at a junction 132, and an inductor L1 and an inductor L2 likewise connected to the junction 132. One terminal of the inductor L2 corresponds to the output 96 of the input matching circuit 92, and is connected to the gate 130*g* of the transistor M1 in accordance with one embodiment of the present disclosure. It is within the purview of those having ordinary skill in the art to tune the aforementioned passive components to impedance match the amplifier circuit 86 and the transistor M1 thereof to the radio frequency signal source that is connected to the signal input port 90.

The output matching circuit 102 is comprised of a capacitor C5 connected to the drain 130*d* of the transistor M1 at a junction 134 corresponding to the input 104. Additionally, connected in series to the capacitor C5 and to ground is an inductor L5. An inductor L7 is connected to the junction 134, and to the LDO voltage regulator 166 and to the equivalent capacitance circuit 68. There is another capacitor C6 connected to the junction 134 and to another junction 136 corresponding to the output 106 of the output matching circuit 102. Also connected to the junction 136 is an inductor L6. The aforementioned passive components of the capacitors C5, C6 and the inductors L5, L6, and L7 are selected to impedance match the amplifier circuit 86, and specifically the transistor M1 thereof, to the components connected to the radio frequency signal output port 100, e.g., the switch 46 and/or the antenna 52. In accordance with various embodiments, the capacitor C5 and the inductor L5 have values selected to define a series resonant circuit at the second harmonic of the operating frequency.

The enable signal 109 is represented as a voltage V1, and is understood to be part of the enable circuit 108. The voltage is connected to a resistor R1, and then to the gate 130*g* of the transistor M1. The resistor R1 is connected to the aforementioned inductor L1 of the input matching circuit 92. In this regard, the output 114 of enable circuit 108 is understood to be the junction between the resistor R1 and the inductor L1, though as described above, functionally the enable signal 109 sets the bias point of the transistor M1. Additionally connected to the resistor R1 and which may be part of the enable circuit 108 is a capacitor C3, which serves radio frequency signal decoupling purposes, that is, the radio frequency signal path is isolated from the bias control circuitry thereby. The specifics of the enable circuit 108 are presented by way of example only, and those having ordinary skill in the art will recognize that various other implementations are possible.

As indicated above, the transistor M1 is biased with the voltage generated by the LDO voltage regulator 66. The input capacitor C7, which corresponds to the aforementioned LDO input capacitor 126, is connected to the power supply port 118 of the power amplifier 48. The output 122 of the LDO voltage regulator 66 is also connected to a capacitor C8 that is implemented on-die and serves a radio frequency decoupling function. According to one embodiment, the capacitor C8 may have a capacitance value in the tens of pico-Farads range. Due to this small value, it is possible to implement on-die.

The output 122 of the LDO voltage regulator 66 is further connected to the equivalent capacitance circuit 68, which is generally comprised of the operational amplifier UC 70 with the aforementioned non-inverting input 72a, the inverting input 72b, and a single-ended output 74. The non-inverting input 72a is connected to ground, and the inverting input 72b is connected to the capacitor CC 76. The resistor RC 78 is connected to the single-ended output 74, and to the capacitor CC 76 at the junction or tap point 80, which in turn is connected to the output 122 of the LDO voltage regulator 66 at a junction 138. Again, the equivalent capacitance circuit 68 is understood to define a capacitance in the nano-Farad to micro-Farad range to serve as an on-die replacement for the output capacitor utilized in connection with the LDO voltage regulator 66. The inductor L7 of the output matching circuit 102 is also connected to the junction 138, thus interconnecting the LDO voltage regulator 66 to the output matching circuit 102, as well as to the amplifier circuit 86.

Figure 7:
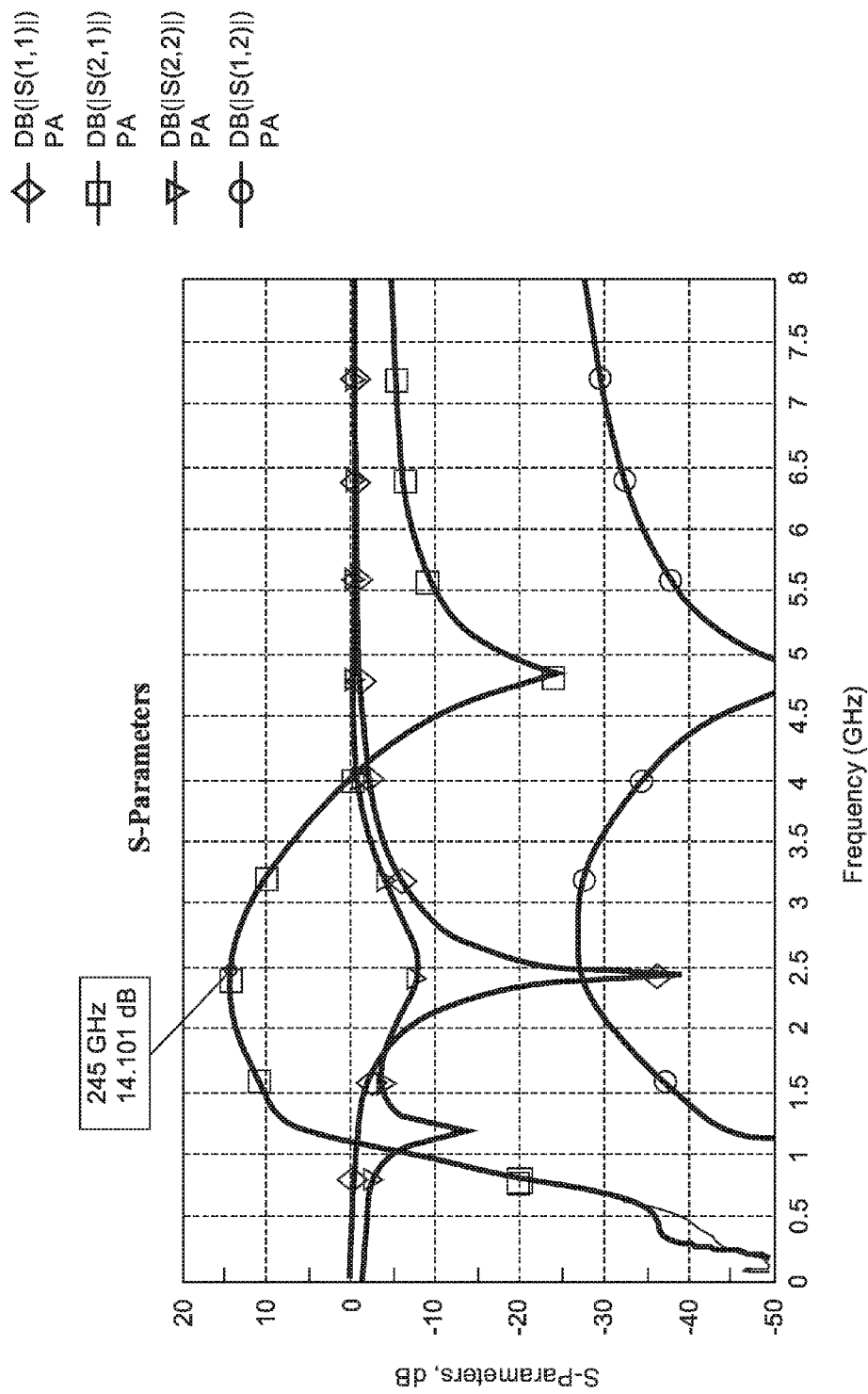
FIG. 7 is a graph plotting the simulated S-parameters of the radio frequency amplifier shown in FIG. 6.

The graph of FIG. 7 plots the simulated scattering parameters (S-parameters) of the power amplifier 48. A first plot 140a is of the input reflection coefficient (S11), a second plot 140b shows the transmission insertion loss (S21), a third plot 140c shows the output reflection coefficient (S22), and a fourth plot 140d shows the transmission isolation (S12). For purposes of this simulation, the capacitor C8 at the output 122 of the LDO voltage regulator 66 is set to 30 pF. It is understood that the substitution of the equivalent capacitance circuit 68 for a true capacitor does not affect the performance of the power amplifier 48. By way of comparison, the graph includes a fifth plot 140e of the transmission insertion loss (S21) with the simulated circuit with an actual capacitor, and there is minor difference at lower frequencies, e.g., ~400 MHz. However, there is no effect on radio frequency performance.

Figure 8A:
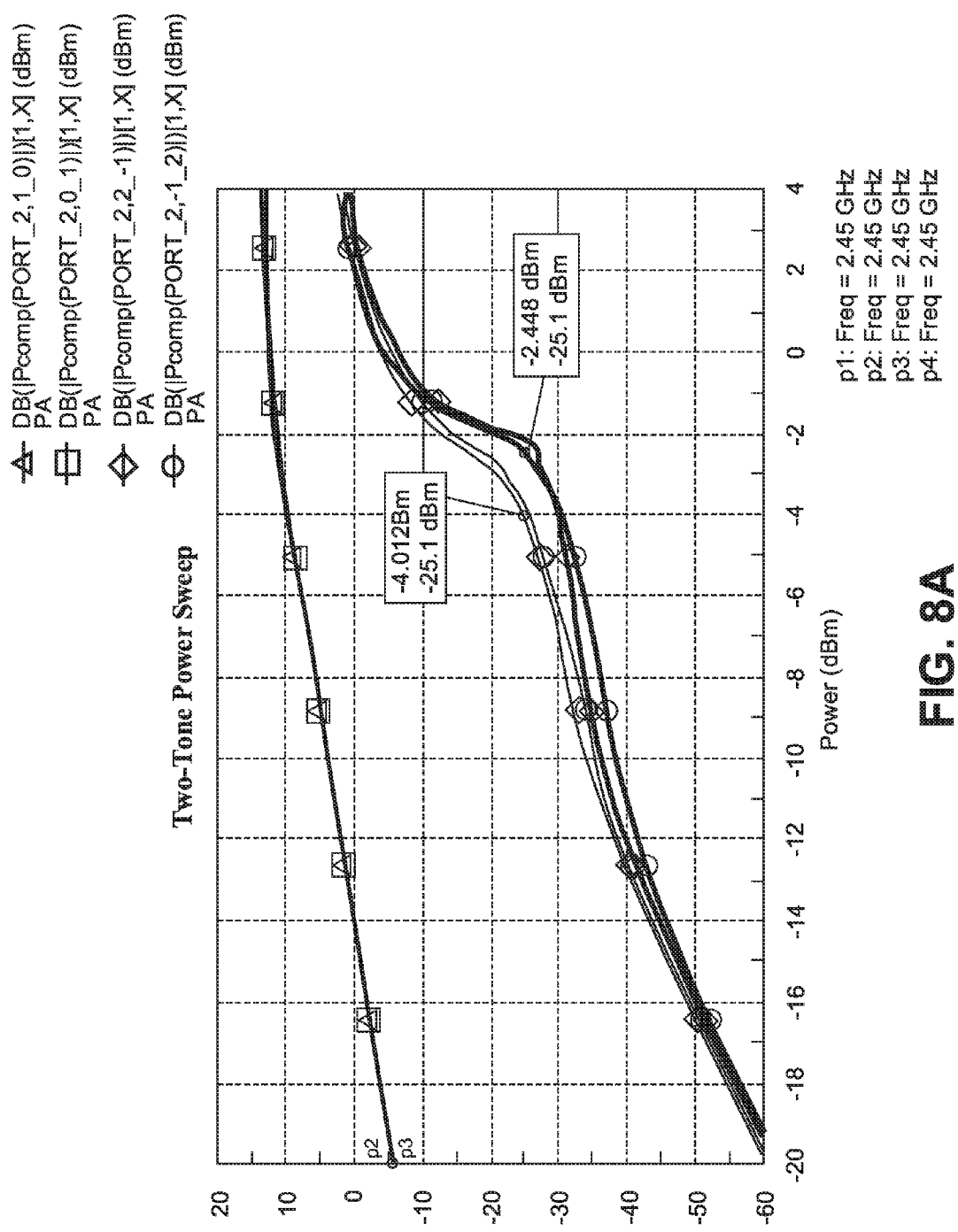
FIGS. 8A and 8B are graphs plotting the simulated two-tone power sweeps of a radio frequency amplifier, with FIG. 8A corresponding to the radio frequency amplifier including the equivalent capacitance circuit as shown in FIG. 6, while FIG. 8B substituting a conventional 10 nF external capacitor.
Figure 8B:
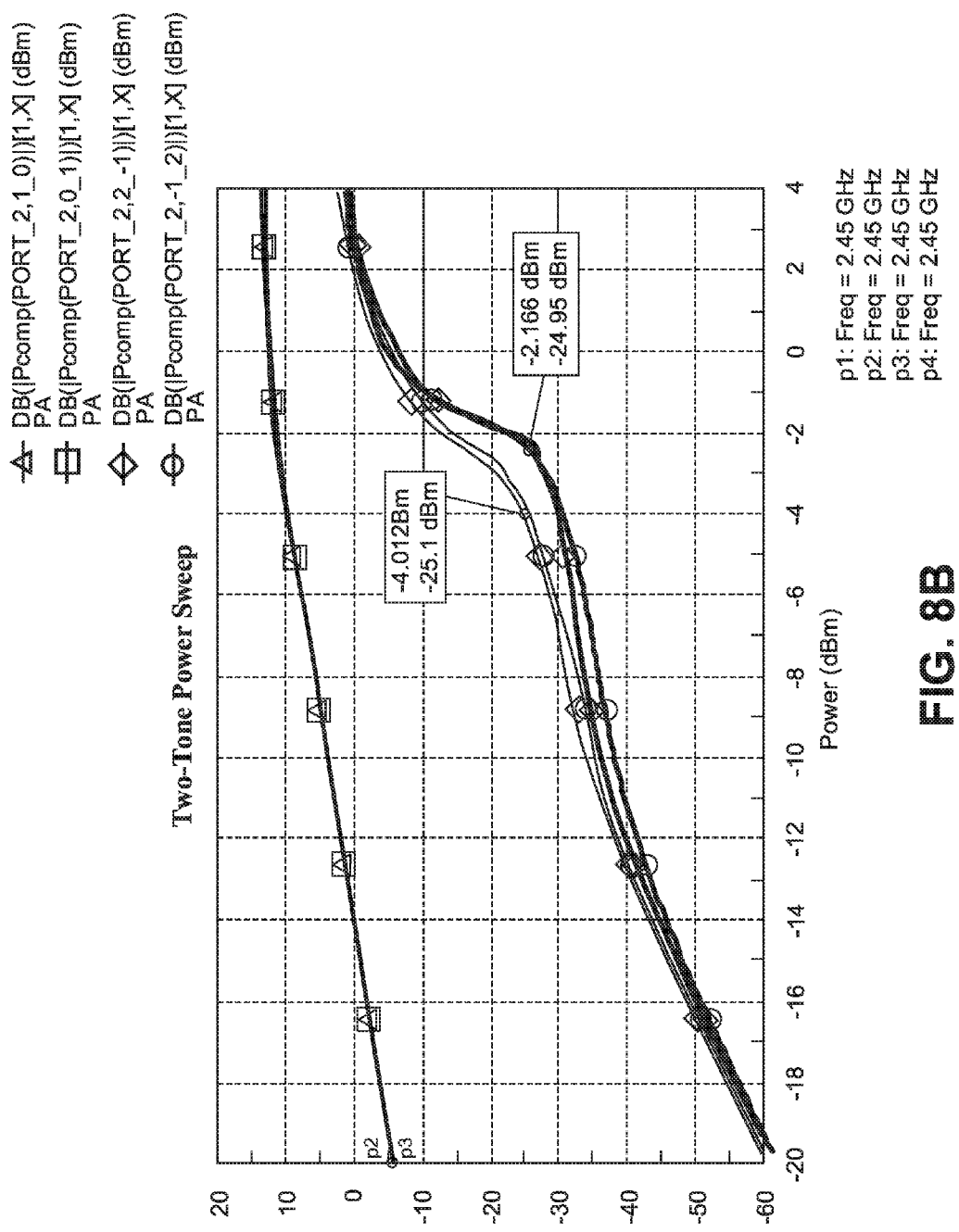
Figure 9:
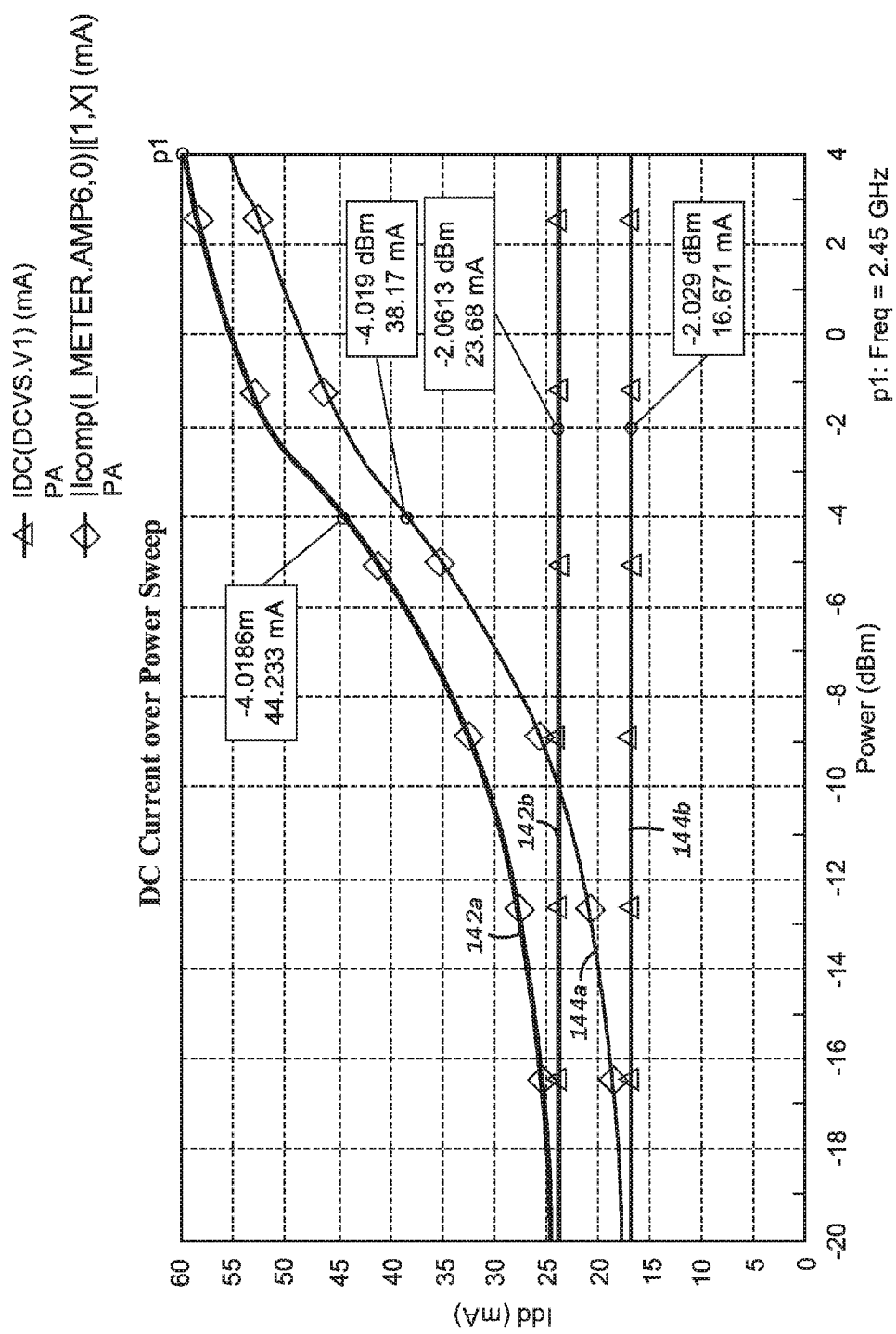
FIG. 9 is a graph plotting the simulated direct current response across a power sweep of a radio frequency amplifier including a first plot pair corresponding to the radio frequency amplifier with the equivalent capacitance circuit as shown in FIG. 6, and a second plot pair corresponding the radio frequency amplifier with a conventional 10 nF external capacitor.

The graphs of FIGS. 8A and 8B plot a two-tone power sweep of the power amplifier 48. FIG. 8A plots the simulated performance of the power amplifier 48 with the equivalent capacitance circuit 68, while FIG. 8B plots the simulated performance of the power amplifier without the equivalent capacitance circuit 68 but with an external LDO voltage regulator output capacitor with a value set to 10 nF connected thereto. Linearity of the power amplifier 48 is nearly identical for both circuits. FIG. 9 plots the simulated direct current response across a power sweep of the power amplifier 48. A first plot pair 142a, 142b is for the power amplifier 48 with the equivalent capacitance circuit 68, while a second plot pair 144a, 144 is for the power amplifier 48 with the external 10 nF capacitor. As illustrated, the use of the equivalent capacitance circuit 68 involves additional current consumption that is associated with the resistor RC 78 and the output impedance of the LDO voltage regulator 66. This is understood to load the bias supply chain.

Figure 10A:
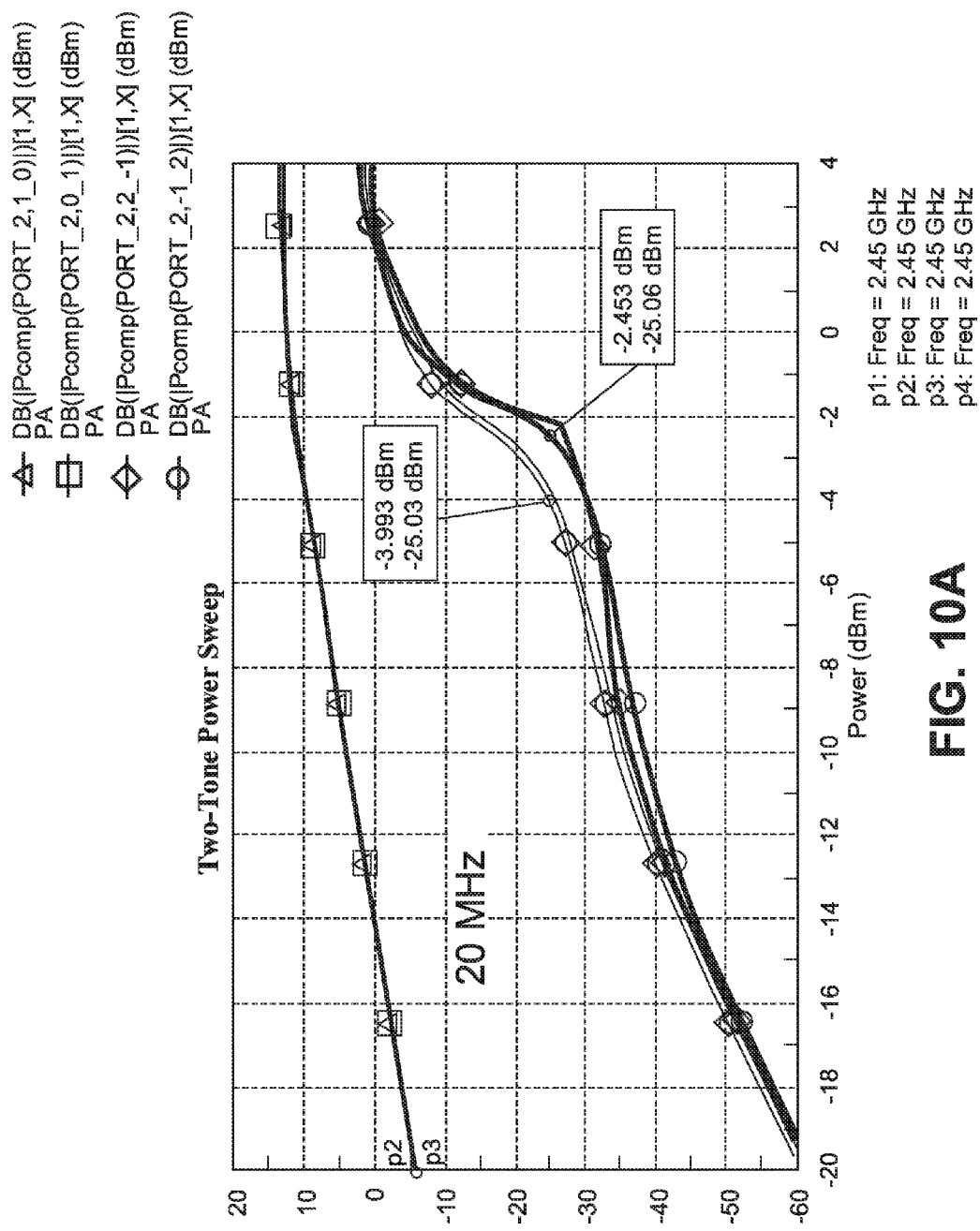
FIG. 10A-C are graphs plotting the simulated two-tone power sweeps of the radio frequency amplifier shown in FIG. 6, with FIG. 10A showing a 20 MHz tone spacing.
Figure 10B:
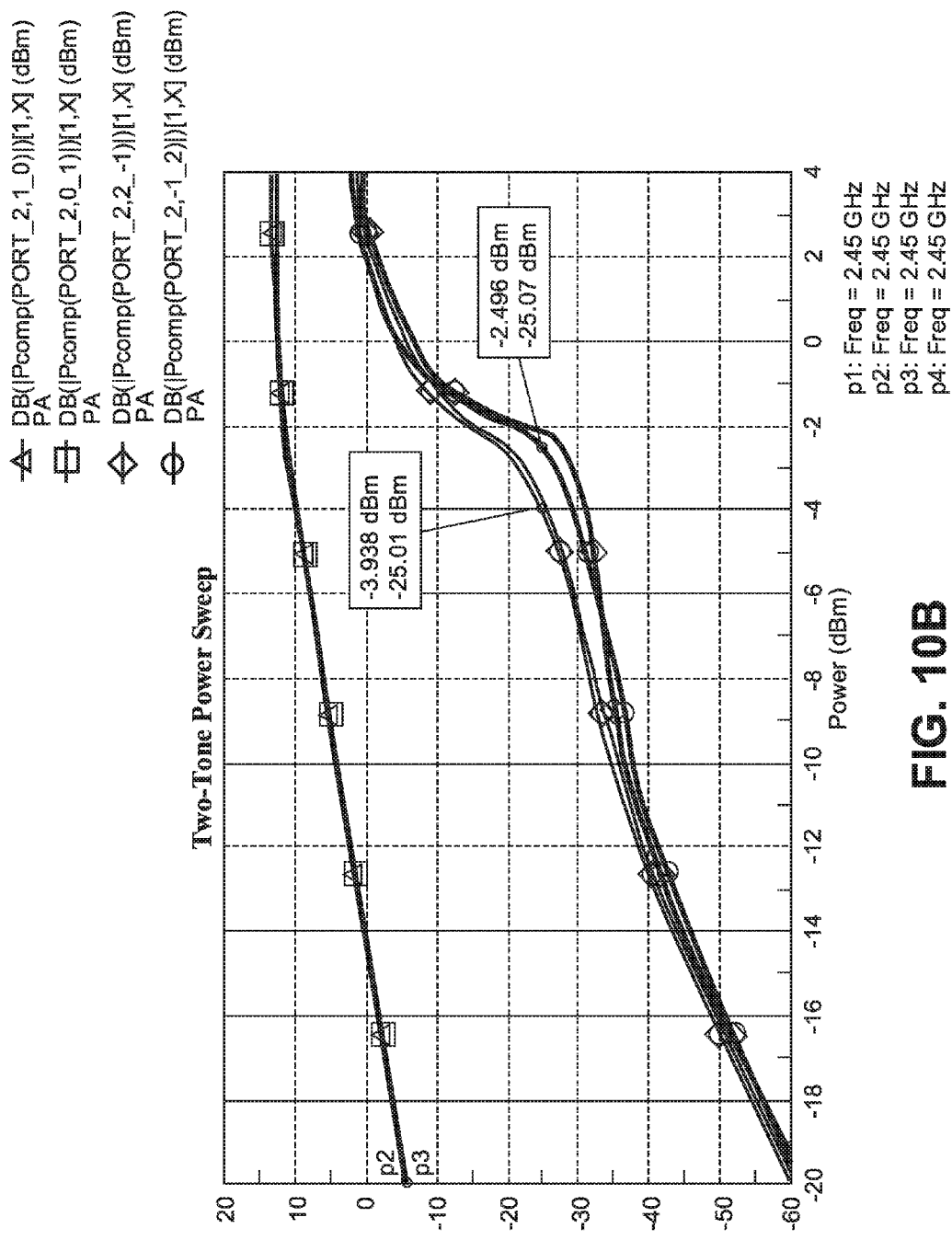
Figure 10C:
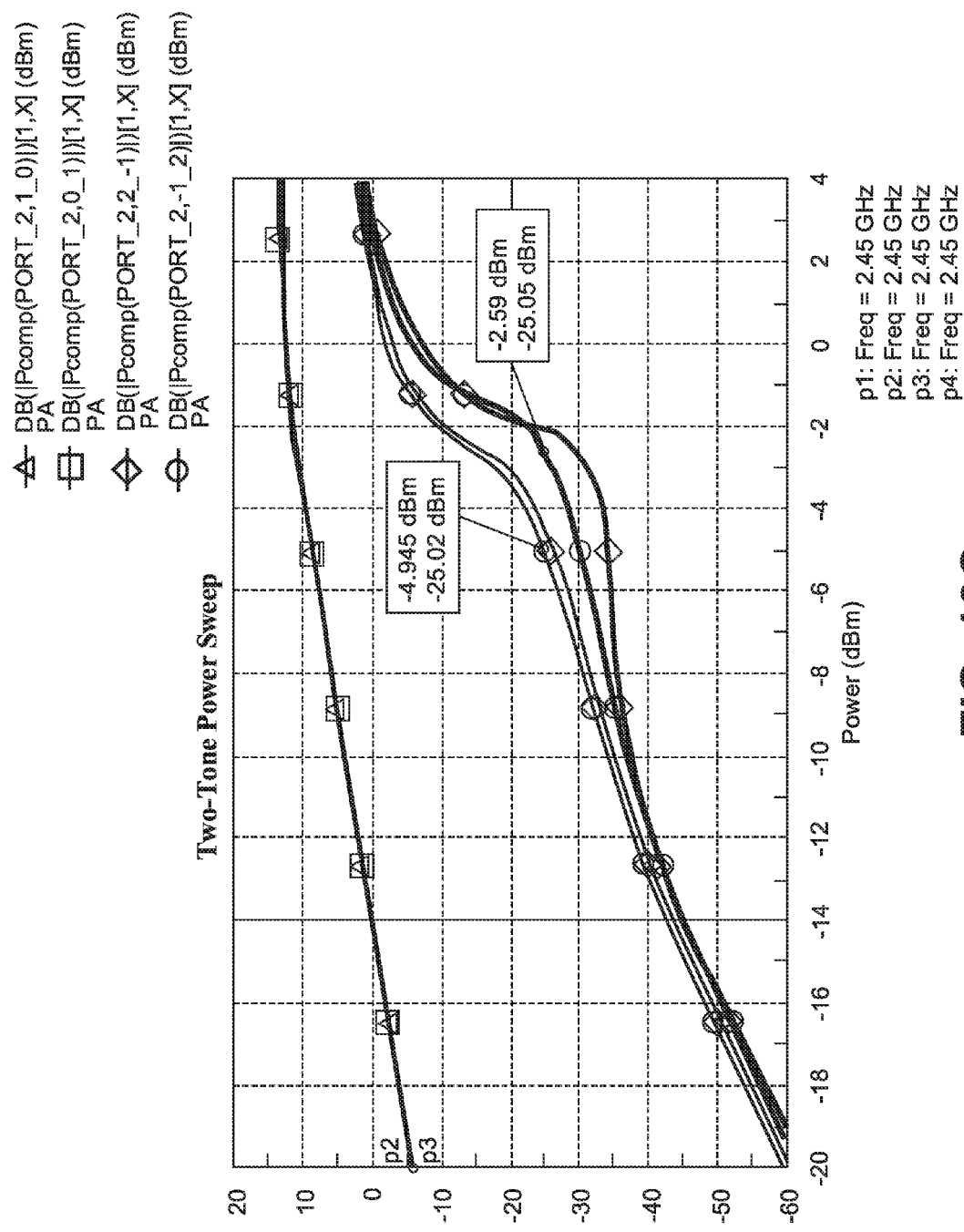

FIGS. 10A-10C plot simulated two-tone power sweeps of the power amplifier 48 utilizing the LDO voltage regulator 66 together with the equivalent capacitance circuit 68 with different frequency spacing. Specifically, FIG. 10A corresponds to a frequency spacing of 20 MHz, FIG. 10B corresponds to a frequency spacing of 40 MHz, and FIG. 10C corresponds to a frequency spacing of 80 MHz. As shown by these graphs, linear power is increased from 1.5 dB to 2.4 dB across the different frequency spacings, which is understood to be nearly identical performance with the external capacitor.

Figure 11:
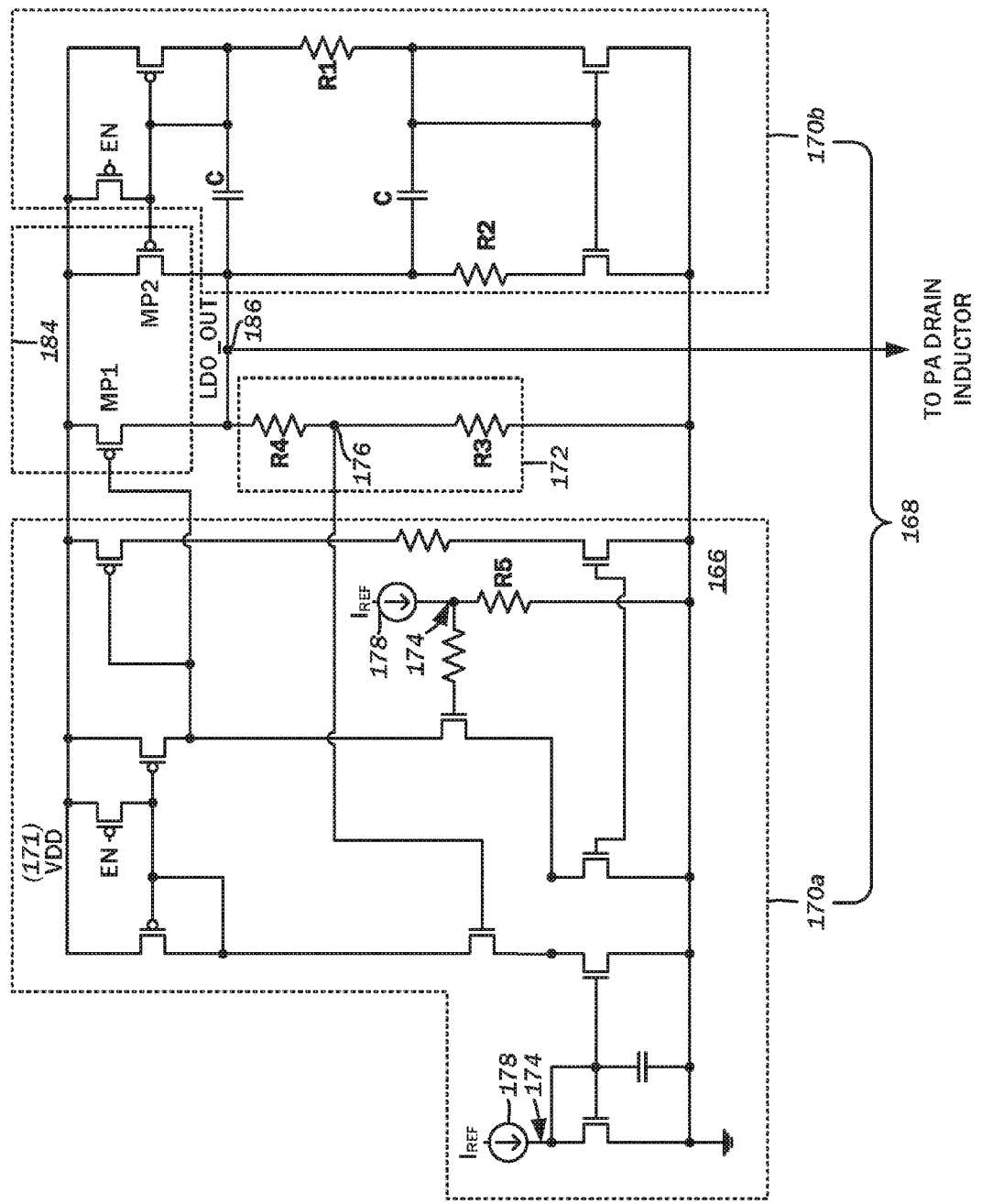
FIG. 11 is a schematic diagram of a small form factor monolithic low dropout voltage regulator circuit with analog pre-distortion capability according to one embodiment of the present disclosure.

With reference to the schematic diagram of FIG. 11, yet another embodiment of the present disclosure is directed to a small form factor monolithic LDO voltage regulator 166. This circuit is understood to have an analog pre-distortion capability, as will be described in greater detail below. The LDO voltage regulator 166 includes an operational amplifier 168 defined by a first circuit segment 170a and a second circuit segment 170b. A voltage supply terminal VDD 171 is connected to the power source 38, which is preferably a battery. The operational amplifier 168 includes a reference input 174 and an error input 176. A reference voltage setting resistor R5 is connected to the reference input 174 and to a current reference $I_{REF}$ 178.

The LDO voltage regulator 166 further includes a feedback circuit 172 comprised of a resistor R4 and a resistor R3. In general, the feedback circuit is connected to the error input 176 of the operational amplifier 168, and defines a feedback factor. A junction 182 between the resistor R4 and the resistor R3 corresponds to the error input 176. The particular values of the resistors R3 and R4 of the feedback circuit 172, as well as the reference voltage setting resistor R5, together with the current reference $I_{REF}$ 178 are understood to define the output voltage of the LDO voltage regulator 166.

As is expected of the LDO voltage regulator 166, there is also a pass circuit 184, specifically a first pass transistor MP1 for the first circuit segment 170a, and a second pass transistor MP2 for the second circuit segment 170b. Both the first pass transistor MP1 and the second pass transistor MP2 are connected to the voltage supply terminal VDD 171. The LDO voltage regulator 166 defines an output port 186 defined by a junction of the first pass transistor MP1 and the second pass transistor MP2. This output port 186 is understood to be characterized by an equivalent capacitance value in the nano-Farad to micro-Farad range. The output current generated from the output port 186 is a summation of the first circuit segment 170a and the second circuit segment 170b. It is contemplated that the size of the first pass transistor MP1 and the second pass transistor MP2 may be adjusted to optimize the circuit for improved linearity or power added efficiency. A resistor R2 may be inserted to minimize extra current by approximately 1.5 mA to 2 mA when large equivalent capacitances in the range of tens to hundreds of nano-Farads are configured. Additionally, resistor R1 may be in the range of a few meg-Ohms to further reduce current to the nano-Ampere range.

Figure 12:
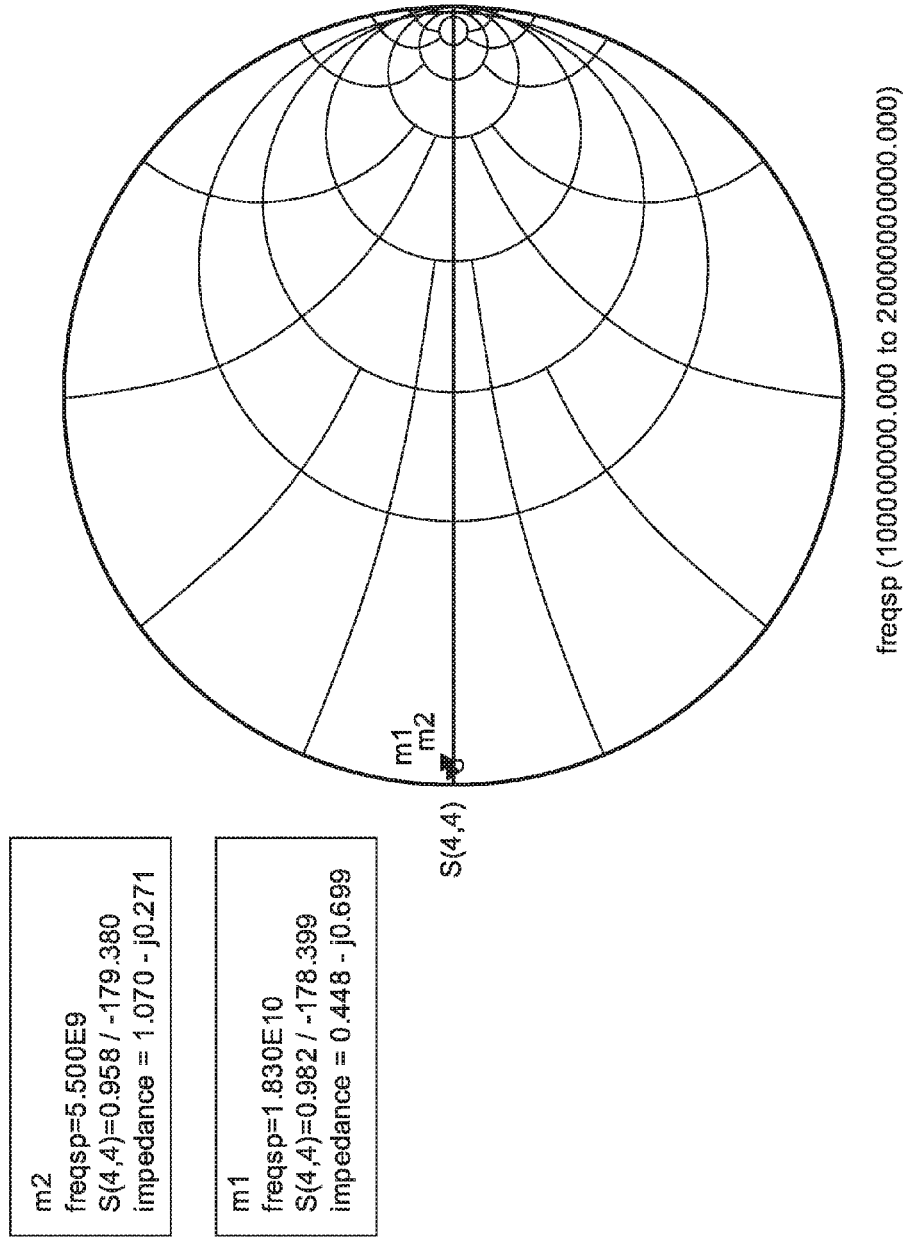
FIG. 12 is a Smith chart plotting the simulated output reflection coefficient of the low dropout voltage regulator circuit shown in FIG. 11.

Referring to FIG. 12, plotted on the Smith chart thereof is the simulated output reflection coefficient S22 at the output port 186 of the LDO voltage regulator 166. The plot illustrates that the impedance has a small value at the low, baseband operating frequency range, as well as the radio frequency carrier signal operating frequency range up to 20 GHz. That is, the output impedance at the output port 186 is within a predefined threshold from a baseband operating frequency range to a carrier frequency range.

Figure 13:
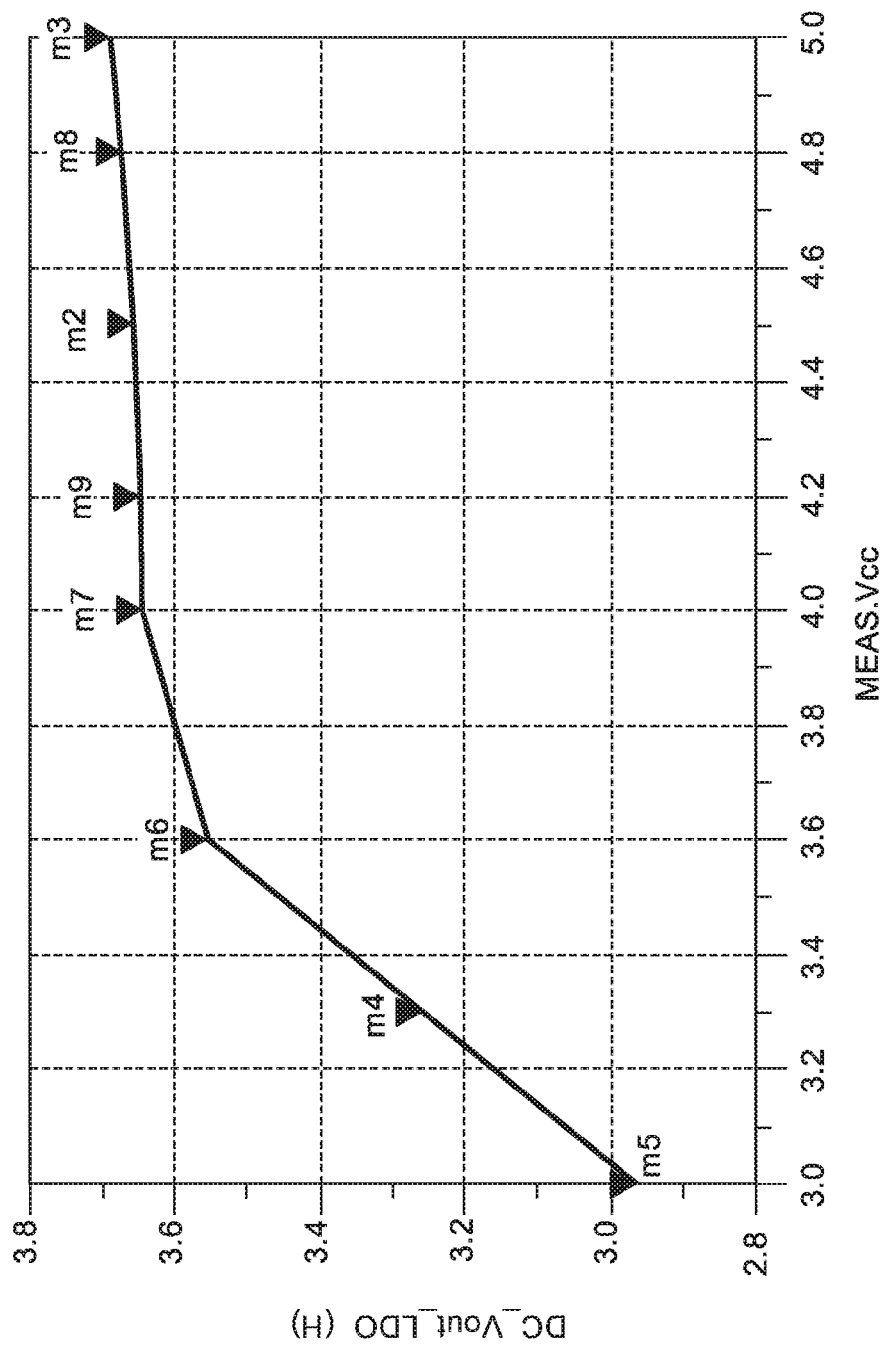
FIG. 13 is a graph plotting the simulated direct current (DC) output of the low dropout voltage regulator circuit shown in FIG. 11 with an input battery supply voltage sweep.

FIG. 13 plots the simulated output direct current from the LDO voltage regulator 166 over a sweep of the battery supply voltage. A plot point M5 corresponds to a battery voltage of 3 V, and the voltage at the output port 186 has a simulated value of 2.962 V. Furthermore, a plot point M4 corresponds to a battery voltage of 3.3 V, in which the output voltage had a simulated value of 3.262 V. A plot point M6 corresponds to a battery voltage of 3.6 V, with a simulated output voltage of 3.555 V. A plot point M7 corresponds to a battery voltage of 4 V, which results in a simulated output voltage of 3.644 V. A plot point M9 corresponds to a battery voltage of 4.2 V, which results in a simulated output voltage of 3.647 V. A plot point M2 corresponds to a battery voltage of 4.5 V, and a simulated output voltage of 3.658 V. A plot point M8 corresponds to a battery voltage of 4.8 V, which results in a simulated output voltage of 3.673 V. Finally, a plot point M3 corresponds to a battery voltage of 5 V that yields a simulated output voltage of 3.687 V.

Figure 14:
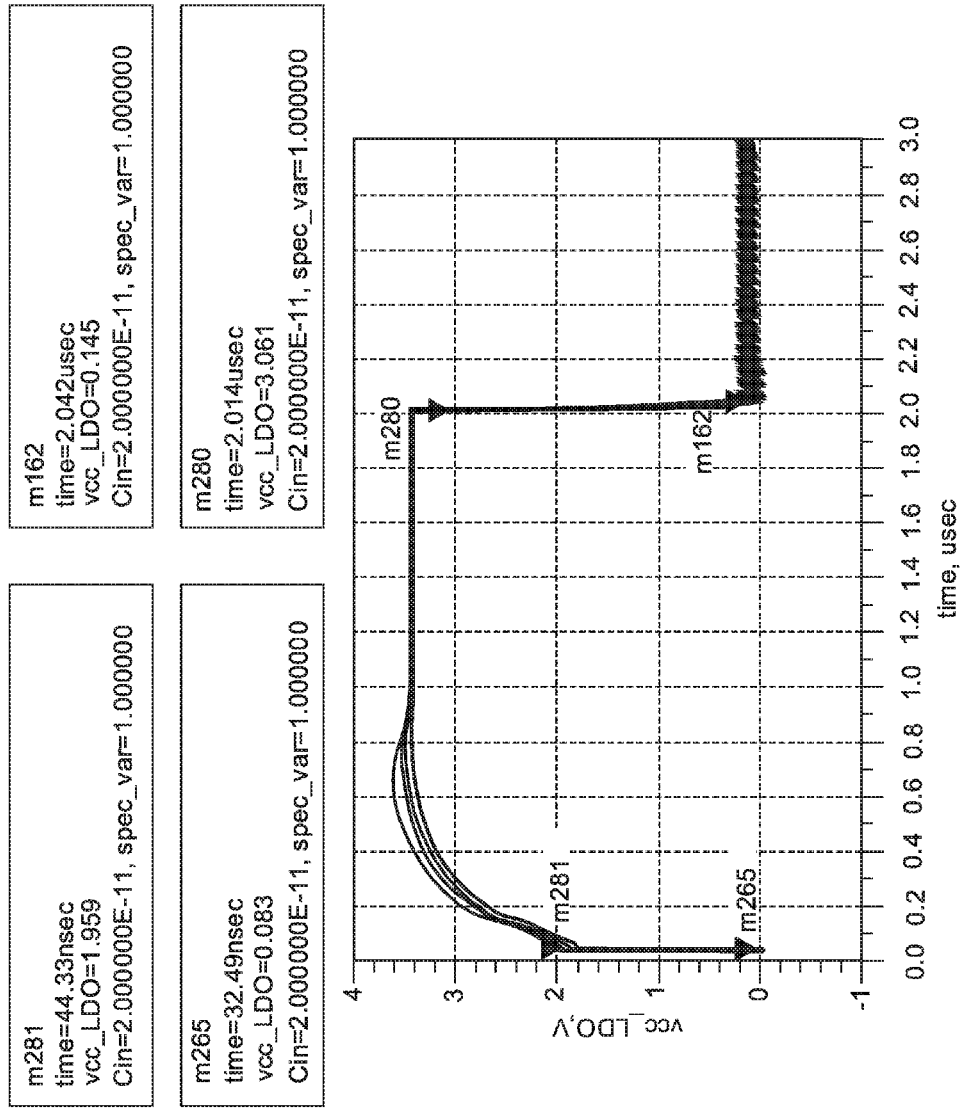
FIG. 14 is a graph plotting the transient response of the output of the low dropout voltage regulator circuit shown in FIG. 11.

Referring now to the graph of FIG. 14, a transient response of the LDO voltage regulator 166 is illustrated. As shown, there is are sharp rising and falling edges, that is, rising edges under 15 nanoseconds, and falling edges less than 30 nanoseconds. This fast switching speed is understood to satisfy the stringent requirements of Wi-Fi front end circuits, which are typically under 400 nanoseconds. Additionally, the rising edge of the output voltage from the LDO voltage regulator 166 is understood to function as an analog pre-distortion to set the error vector magnitude (EVM) base for the transmission preamble. The data stream following this is understood to exhibit lower error vector magnitude floors and improved error vector magnitude power. The specifics of the rising edge can be set for optimum analog pre-distortion compensation by adjusting/trimming the capacitors of the LDO voltage regulator 166. Particularly with respect to CMOS-based implementations, this pre-distortion resolves the breakdown voltage and output power linearity issues associated therewith.

Figure 15A:
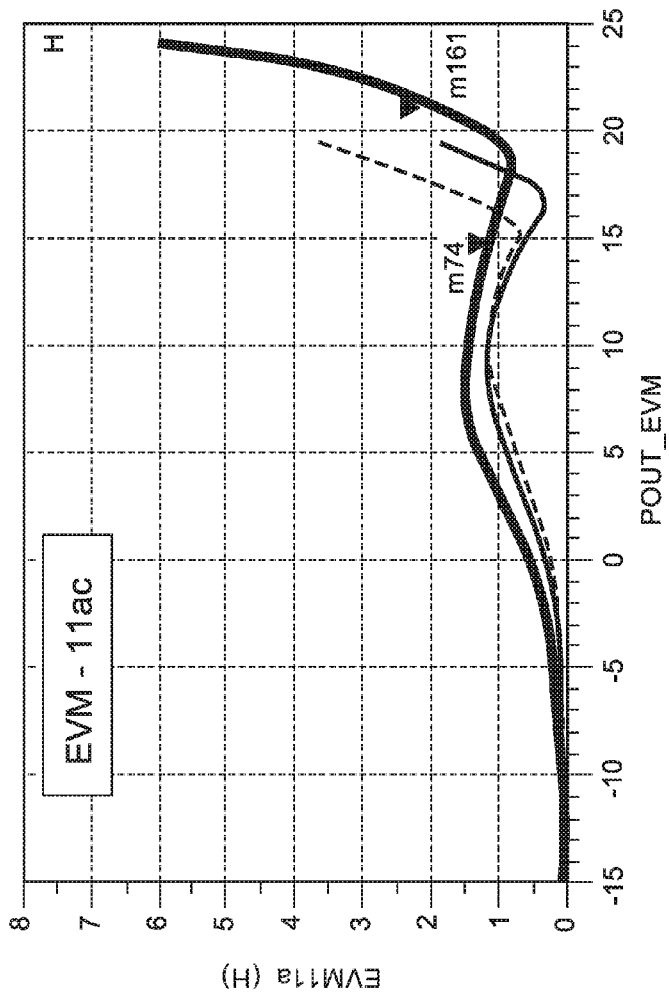
FIGS. 15A and 15B are graphs plotting the error vector magnitude versus output power given a sample IEEE 802.11ac signal, with FIG. 15A showing the percentage error vector magnitude and FIG. 15B showing the decibels error vector magnitude.
Figure 15B:
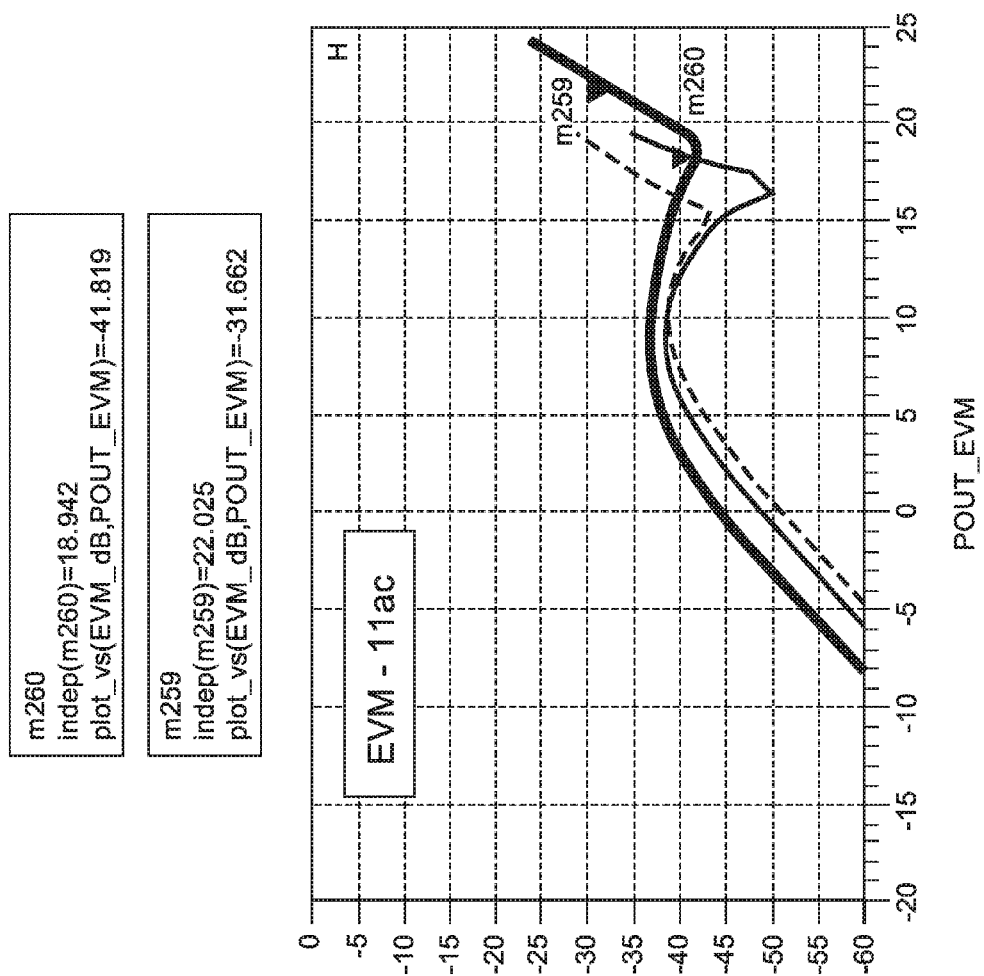

The graphs of FIGS. 15A and 15B plot the error vector magnitude simulation results versus output power of the power amplifier 48 based upon an Institute of Electrical and Electronics Engineers (IEEE) 802.11ac two-tone input radio frequency signal. FIG. 15A in particular plots the EVM as a percentage, while FIG. 15B lots the EVM as decibels (dB). A first plot 190a, 190b in each graph corresponds to the power amplifier 48 with the LDO voltage regulator 166, while a second plot 192a, 192b in each graph corresponds to that of a 1 µF external capacitor. A third plot 194a, 194b in each graph shows the EVM of the standalone power amplifier 48. As shown, with the LDO voltage regulator 166, higher linear power is possible.

Figure 16A:
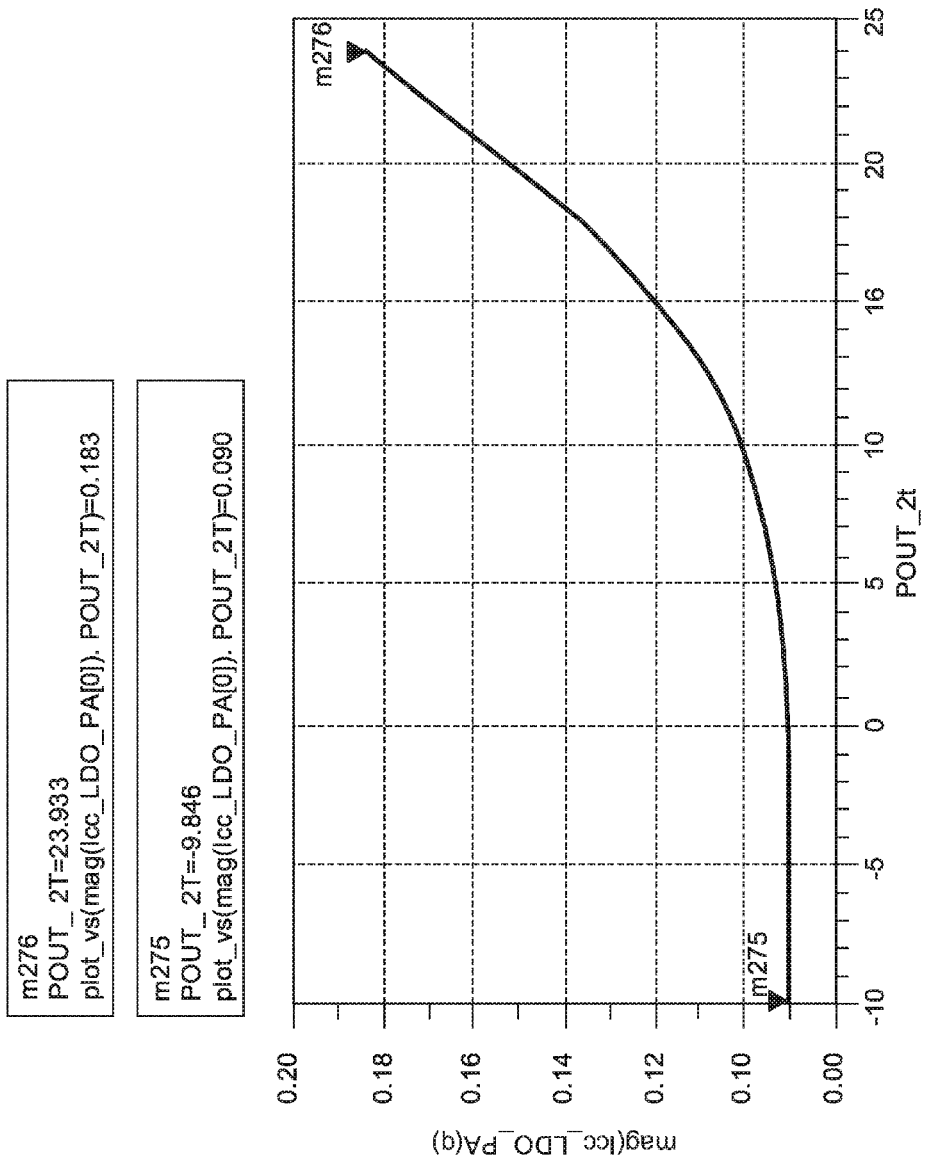
FIGS. 16A-16C are graphs showing the direct current consumption versus output power of the low dropout voltage regulator circuit shown in FIG. 11.
Figure 16B:
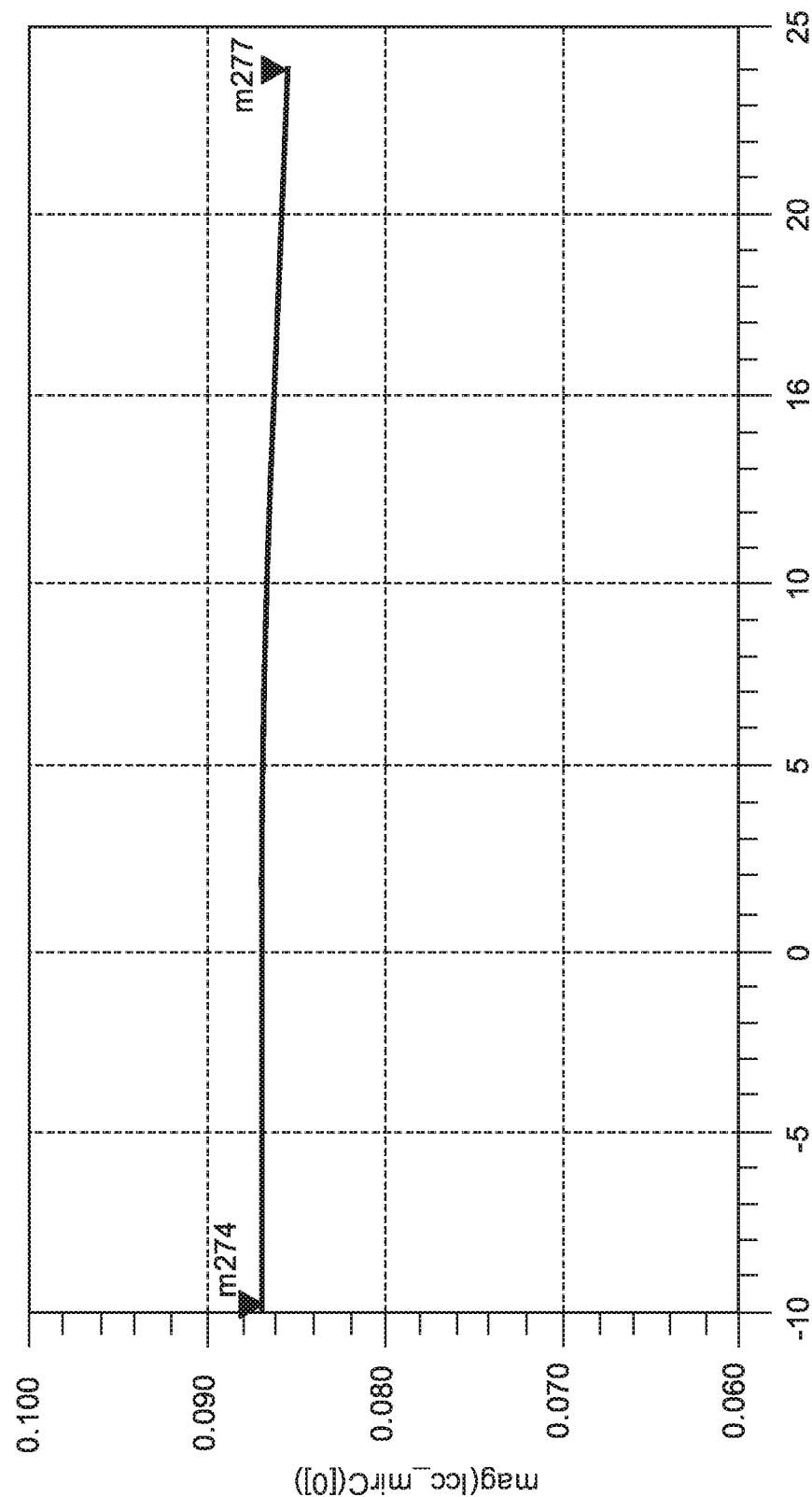
Figure 16C:
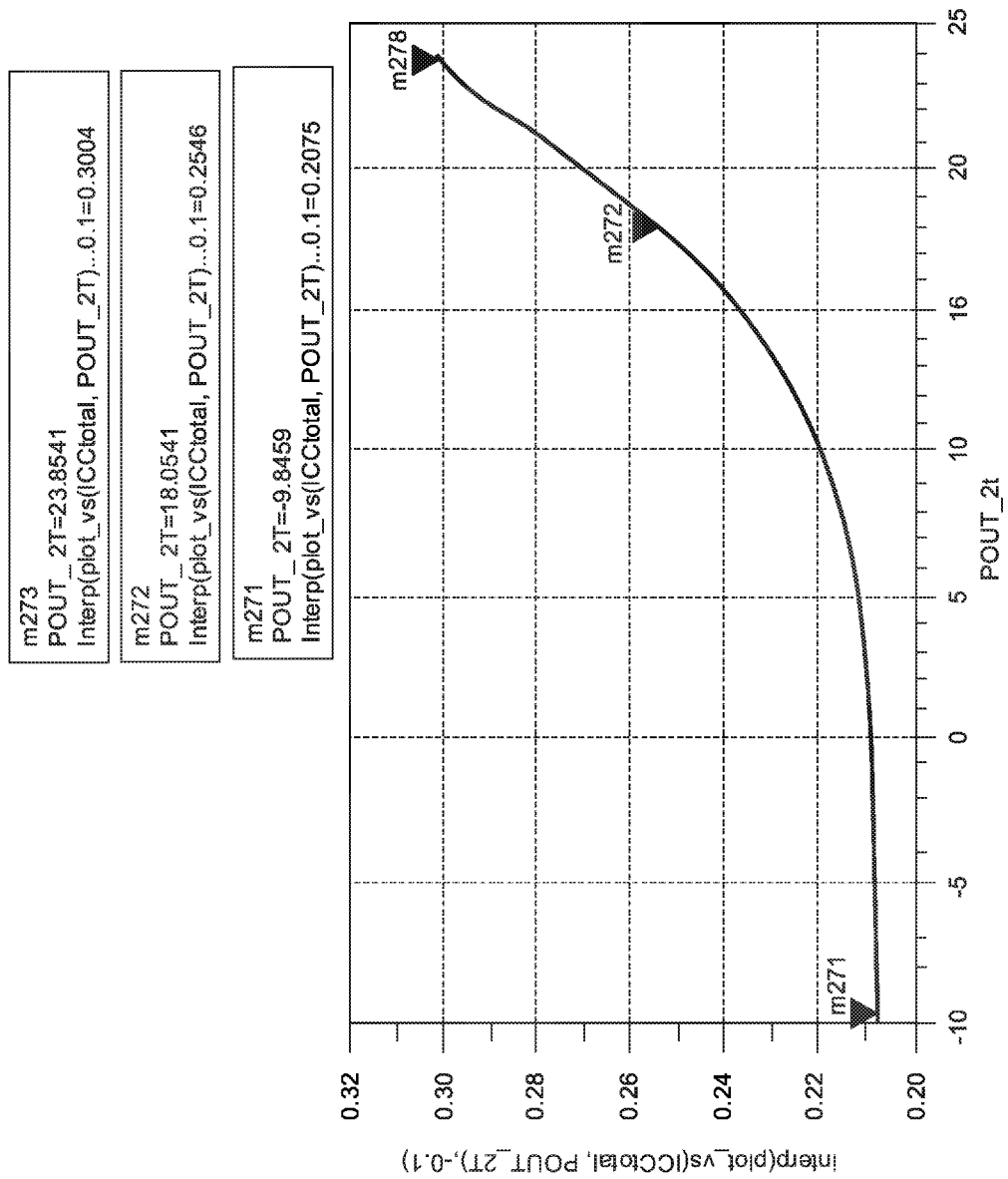

With reference to the graphs of FIGS. 16A-16C, the direct current (DC) current consumption versus output power of the LDO voltage regulator 166 are plotted. The current consumption is close to a constant value, and increases proportionally to the output power.

Figure 17:
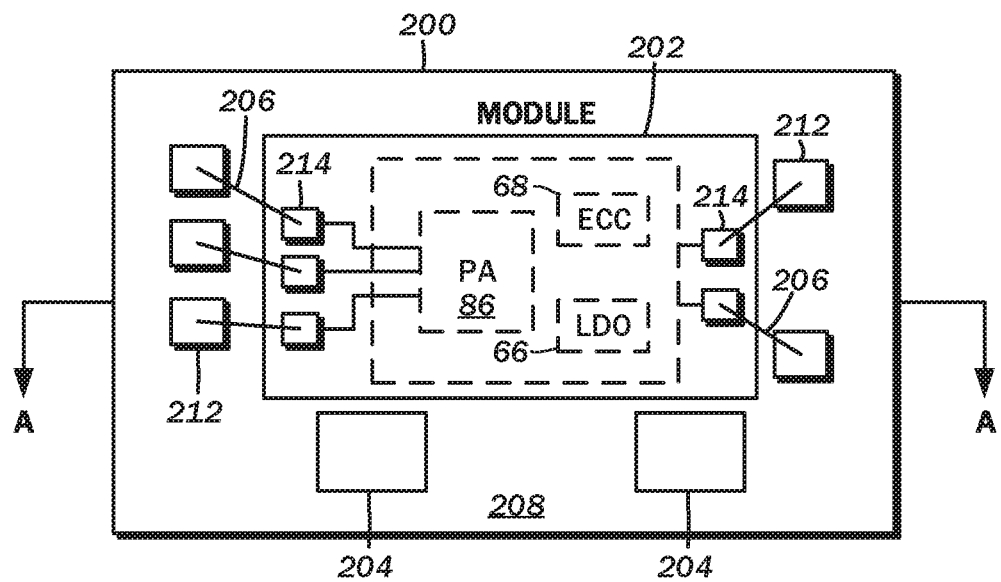
FIG. 17 is a schematic diagram of a packaged amplifier module.
Figure 18:
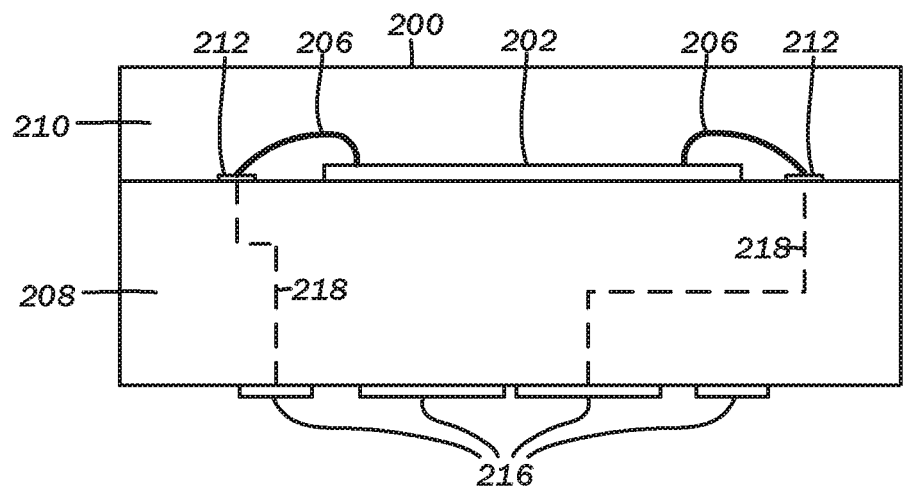
FIG. 18 is a schematic diagram of a cross-section of the packaged amplifier module shown in FIG. 17.

FIG. 17 is a schematic diagram of an embodiment of a packaged radio frequency communications module 200, while FIG. 18 is a schematic diagram of a cross-section of the packaged radio frequency communications module 200 taken along axis A-A of FIG. 17. The packaged radio frequency communications module 200 includes an integrated circuit or die 202, surface mount components 204, wire bonds 206, a package substrate 208, and an encapsulation structure 210. The package substrate 208 includes pads 212 formed from conductors disposed therein. Additionally, the die 202 includes pads 214, and the wire bonds 206 are used to electrically connect the pads 214 of the die 202 to the pads 212 of the package substrate 208.

The die 202 includes the power amplifier 48 of the present disclosure formed therein, including the amplifier circuit 86, as well as the LDO voltage regulator 66 and the equivalent capacitance circuit 68, or the alternative embodiment of the LDO voltage regulator 166. These components on the die 202 are understood to be as described above. Again, it is expressly contemplated that the LDO voltage regulator 66 is fabricated on the same die 202 as the equivalent capacitance circuit 68 so as to avoid the need for an externally connected large value capacitor to serve as the LDO output capacitor. Additionally, this is understood to eliminate the need for a large footprint capacitor on the die 202.

The die 202 is mounted to the package substrate 208 as shown, though it may be configured to receive a plurality of additional components such as the surface mount components 204. These components include additional integrated circuits as well as passive components such as capacitors, inductors, and resistors.

As shown in FIG. 17, the packaged radio frequency communications module 200 is shown to include a plurality of contact pads 216 disposed on the side of the packaged radio frequency communications module 200 opposite the side used to mount the die 202. Configuring the packaged radio frequency communications module 200 in this manner can aid in connecting the same to a circuit board of the wireless communications device 10. The example contact pads 216 can be configured to provide radio frequency signals, bias signals, power low voltage(s) and or power high voltage(s) to the die 202 and/or the surface mount components 204. The electrical connections between the contact pads 216 and the die 202 can be facilitated by connections 218 through the package substrate 208. The connections 218 can represent electrical oaths formed through the package substrate 208, such as connections associated with vias and conductors of a multilayer laminated package substrate.

In some embodiments, the packaged radio frequency communications module 200 can also include or more packaging structures to, for example, provide protection and/or to facilitate handling of the packaged radio frequency communications module 200. Such a packaging structure can include overmold or encapsulation structure 210 formed over the package substrate 208 and the components and die(s) disposed thereon.

It will be understood that although the packaged radio frequency communications module 200 is described in the context of electrical connections based on wire bonds, one or more features of the present disclosure can also be implemented in other packaging configurations, including, for example, flip-chip configurations.

The particulars shown herein are by way of example and for purposes of illustrative discussion of the embodiments of the low dropout voltage regulators, equivalent capacitor circuits utilized therein, and amplifier circuits incorporating such low dropout voltage regulators, and are presented in the cause of providing what is believed to be the most useful and readily understood description of the principles and conceptual aspects. While these embodiments have been described in terms of a radio frequency communications circuit, it will be recognized that such embodiments may be adapted to other applications, whether analog systems or digital systems. No attempt is made to show details with more particularity than is necessary, the description taken with the drawings making apparent to those skilled in the art how the several forms of the present disclosure may be embodied in practice.

What is claimed is:

1. A radio frequency amplifier circuit with a signal input and a signal output, the circuit comprising:
   a primary amplifier connected to the signal input and the signal output;
   a low dropout voltage regulator connectible to an external power supply and to the primary amplifier, the low dropout voltage regulator generating a set voltage to bias the primary amplifier from a variable voltage provided by the external power supply; and
   an equivalent capacitance circuit connected to the primary amplifier and to the low dropout voltage regulator, the equivalent capacitance circuit defining a low dropout voltage regulator output capacitance dependent upon a baseband operating frequency of the primary amplifier in a nano-Farad to micro-Farad range absent any passive capacitor components corresponding thereto to maintain linearity of the primary amplifier.

2. The radio frequency amplifier circuit of claim 1 wherein the equivalent capacitance circuit includes an active component.

3. The radio frequency amplifier circuit of claim 2 wherein the active component is an operational amplifier with a non-inverting input, an inverting input, and a single-ended output.

4. The radio frequency amplifier circuit of claim 3 further comprising a first capacitor connected to the inverting input and a first resistor connected the single-ended output, the first capacitor further being connected to the first resistor at a tap point, the equivalent capacitance circuit being connected to the low dropout voltage regulator and the primary amplifier at the tap point.

5. The radio frequency amplifier circuit of claim 1 further comprising an input capacitor connected to an input of the low dropout voltage regulator.

6. The radio frequency amplifier circuit of claim 1 wherein the primary amplifier is a power amplifier.

7. The radio frequency amplifier circuit of claim 1 further comprising a radio frequency decoupling capacitor connected to an output of the low dropout voltage regulator.

8. The radio frequency amplifier circuit of claim 1 further comprising an enable circuit connected to the primary amplifier stage, the enable circuit selectively activating the primary amplifier in response to an enable input.

9. The radio frequency amplifier circuit of claim 1 further comprising an input matching circuit connected to the signal input and to an input of the primary amplifier.

10. The radio frequency amplifier circuit of claim 1 further comprising an output matching circuit connected to an output of the primary amplifier and the signal output.

11. The radio frequency amplifier circuit of claim 1 wherein the primary amplifier, the low dropout voltage regulator, and the equivalent capacitance circuit are fabricated on a single semiconductor die.

12. An equivalent capacitance circuit connectable to an output of a low dropout voltage regulator for a radio frequency amplifier circuit, the equivalent capacitance circuit comprising:
    an operational amplifier with an inverting input, a non-inverting input connected to ground, and a single-ended output;
    a capacitor connected to the inverting input of the operational amplifier;
    a resistor directly connected to the single-ended output of the operational amplifier; and
    a tap point at a junction directly connecting the capacitor and the resistor, the output of the low dropout voltage regulator being connectable thereto, with the tap point defining an equivalent capacitance value in a nano-Farad to micro-Farad range at a predefined operating frequency.

13. The equivalent capacitance circuit of claim 12 wherein the operational amplifier is configured to have a gain of at least 200.

14. The equivalent capacitance circuit of claim 13 wherein an output impedance at the tap point is under 300 Ohm.

15. A radio frequency communications module comprising:
    a packaging substrate on which a plurality of components are mounted;
    a primary amplifier implemented on the packaging substrate;
    a low dropout voltage regulator implemented on the packaging substrate and connectible to an external power supply and to the primary amplifier;
    an equivalent capacitance circuit implemented on the packaging substrate and connected to the primary amplifier and to the low dropout voltage regulator, the equivalent capacitance circuit defining a low dropout voltage regulator output capacitance dependent upon a baseband operating frequency of the primary amplifier in a nano-Farad to micro-Farad range absent any passive capacitor components corresponding thereto.

16. The module of claim 15 wherein the equivalent capacitance circuit includes an active component.

17. The module of claim 16 wherein the active component is an operational amplifier with a non-inverting input, an inverting input, and a single-ended output.

18. The module of claim 17 further comprising a first capacitor connected to the inverting input and a first resistor connected the single-ended output, the first capacitor further being connected to the first resistor at a tap point, the equivalent capacitance circuit being connected to the low dropout voltage regulator and the primary amplifier at the tap point.

19. A wireless communications device comprising:
    an antenna receptive to an incoming radio frequency signal and transmissive of an outgoing radio frequency signal;
    a radio frequency amplifier circuit connected to the antenna;
    a low dropout regulator connectible to an external power supply and to the radio frequency amplifier circuit to set the bias point thereof;
    an equivalent capacitance circuit connected to the radio frequency amplifier circuit and to the low dropout voltage regulator, the equivalent capacitance circuit defining a low dropout voltage regulator output capacitance dependent upon a baseband operating frequency of the radio frequency amplifier circuit in a nano-Farad to micro-Farad range absent any passive capacitor components corresponding thereto.

20. The device of claim 19 wherein the equivalent capacitance circuit includes an active component.

21. The device of claim 20 wherein the active component is an operational amplifier with a non-inverting input, an inverting input, and a single-ended output.

22. The device of claim 21 further comprising a first capacitor connected to the inverting input and a first resistor connected the single-ended output, the first capacitor further being connected to the first resistor at a tap point, the equivalent capacitance circuit being connected to the low dropout voltage regulator and the primary amplifier at the tap point.

* * * * *